(12) United States Patent
Lee et al.

(10) Patent No.: US 12,082,480 B2
(45) Date of Patent: *Sep. 3, 2024

(54) DISPLAY DEVICE AND METHOD FOR MANUFACTURING THE SAME

(71) Applicant: Samsung Display Co., Ltd., Yongin-si (KR)

(72) Inventors: Jongsuk Lee, Asan-si (KR); Jihoon Song, Incheon (KR); Sangbong Lee, Yongin-si (KR); Jihoon Kim, Asan-si (KR); Yonghwan Yoon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/136,440

(22) Filed: Apr. 19, 2023

(65) Prior Publication Data

US 2023/0301162 A1    Sep. 21, 2023

Related U.S. Application Data

(63) Continuation of application No. 17/101,426, filed on Nov. 23, 2020, now Pat. No. 11,653,552.

(30) Foreign Application Priority Data

Feb. 25, 2020   (KR) .................. 10-2020-0023174

(51) Int. Cl.
*H10K 71/00* (2023.01)
*H10K 50/84* (2023.01)
(Continued)

(52) U.S. Cl.
CPC ............. *H10K 71/00* (2023.02); *H10K 50/84* (2023.02); *H10K 50/86* (2023.02); *H10K 59/12* (2023.02); *H10K 77/10* (2023.02)

(58) Field of Classification Search
CPC ........ H10K 71/00; H10K 50/84; H10K 50/86; H10K 59/12; H10K 77/10; H10K 50/865;
(Continued)

(56) References Cited

U.S. PATENT DOCUMENTS 10,466,822 B2   11/2019   Kim et al.
11,349,109 B2   5/2022   Kim
(Continued)

FOREIGN PATENT DOCUMENTS

KR    1020180063633 A    6/2018

*Primary Examiner* — Kevin Quarterman
(74) *Attorney, Agent, or Firm* — CANTOR COLBURN LLP

(57) ABSTRACT

A display device includes a display panel including a display area including a light blocking area and a non-display area around the display area, a base film disposed on the display panel, a light blocking layer that overlaps the light blocking area and is disposed on a surface of the base film, a first adhesive disposed between the display panel and the base film, a window disposed on the base film, and a second adhesive disposed between the window and the base film. A first hole defined in a portion of the light blocking area passes through the base film, the light blocking layer, the first adhesive, and the second adhesive.

16 Claims, 27 Drawing Sheets

(51) Int. Cl.
*H10K 50/86* (2023.01)
*H10K 59/12* (2023.01)
*H10K 77/10* (2023.01)

(58) Field of Classification Search
CPC ...... H10K 59/87; H10K 59/00; H10K 50/868;
H10K 59/124; H10K 59/126; H10K
50/8426; H10K 59/40; H10K 2102/302;
H10K 71/851; G06F 3/044
See application file for complete search history.

(56) References Cited

U.S. PATENT DOCUMENTS

| | | | |
|---|---|---|---|
| 11,653,552 B2 * | 5/2023 | Lee | H10K 59/00 |
| | | | 361/679.01 |
| 2019/0051858 A1 | 2/2019 | Tomioka et al. | |
| 2020/0136066 A1 | 4/2020 | Jin | |
| 2020/0168848 A1 | 5/2020 | Jung et al. | |
| 2020/0168850 A1 | 5/2020 | Park et al. | |
| 2021/0074876 A1 | 3/2021 | Kishimoto | |

* cited by examiner

DISPLAY DEVICE AND METHOD FOR MANUFACTURING THE SAME

This application is a continuation of U.S. patent application Ser. No. 17/101,426, filed on Nov. 23, 2020, which claims priority to Korean Patent Application No. 10-2020-0023174, filed on Feb. 25, 2020, and all the benefits accruing therefrom under 35 U.S.C. § 119, the content of which in its entirety is herein incorporated by reference.

BACKGROUND

1. Field

Embodiments of the invention herein relate to a display device and a method for manufacturing the same.

2. Description of the Related Art

In general, electronic equipment such as smartphones, digital cameras, laptop computers, navigations, smart televisions, and the like, for providing an image to a user includes display devices for displaying an image. Such display devices generate an image to provide the generated image to the user through a display screen.

The display devices include a display panel for generating an image and functional elements that provide various functions to the user. The functional elements include a speaker, a camera, a sensor, and the like. A plurality of holes is defined in the display panel, and functional elements are disposed in the holes. When the display device is manufactured, cutoff areas of the display panel are removed, and the holes are defined in the display panel.

SUMMARY

Embodiments of the invention provide a display device, in which more accurate holes are defined, and a method for manufacturing the same.

Embodiments of the invention also provide a method for manufacturing a display device, which is capable of reducing damage of the display device.

An embodiment of the invention provides a display device including a display panel including a display area including a light blocking area and a non-display area around the display area, a base film disposed on the display panel, a light blocking layer that overlaps the light blocking area and is disposed on a surface of the base film, a first adhesive disposed between the display panel and the base film, a window disposed on the base film, and a second adhesive disposed between the window and the base film, where a first hole defined in a portion of the light blocking area passes through the base film, the light blocking layer, the first adhesive, and a second adhesive.

In an embodiment of the invention, a method for manufacturing a display device includes preparing a panel which includes a display panel, a polarizing film disposed on the display panel, a first adhesive disposed on the polarizing film, a deco film disposed on the first adhesive, a first protective film disposed below the display panel, and a second protective film disposed on the deco film and on which a cutoff area defined as a cutoff line having a closed curve is defined, irradiating a first intense light from a side of the first protective film toward the cutoff line to cut portions of the first protective film, the display panel, and the polarizing film, which overlap the cutoff area, and irradiating a second intense light from the side of the first protective film toward the cutoff line to cut portions of the first adhesive, the deco film, and the second protective film, which overlap the cutoff area, where the second intense light has power greater than power of the first intense light.

In an embodiment of the invention, a method for manufacturing a display device includes preparing a panel which includes a display panel including a light blocking area, a polarizing film disposed on the display panel, a deco film including a light blocking layer that is disposed on the polarizing film and overlaps the light blocking area, an adhesive disposed on the deco film, a first protective film disposed below the display panel, and a second protective film disposed on the adhesive and on which a cutoff area defined as a cutoff line having a closed curve is defined, irradiating a first intense light from a side of the first protective film toward the cutoff line to cut portions of the first protective film, the display panel, the polarizing film, and deco film, which overlap the cutoff area, and irradiating a second intense light from the side of the first protective film toward the cutoff line to cut portions of the adhesive and the second protective film, which overlap the cutoff area, where the second intense light has power greater than power of the first intense light.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
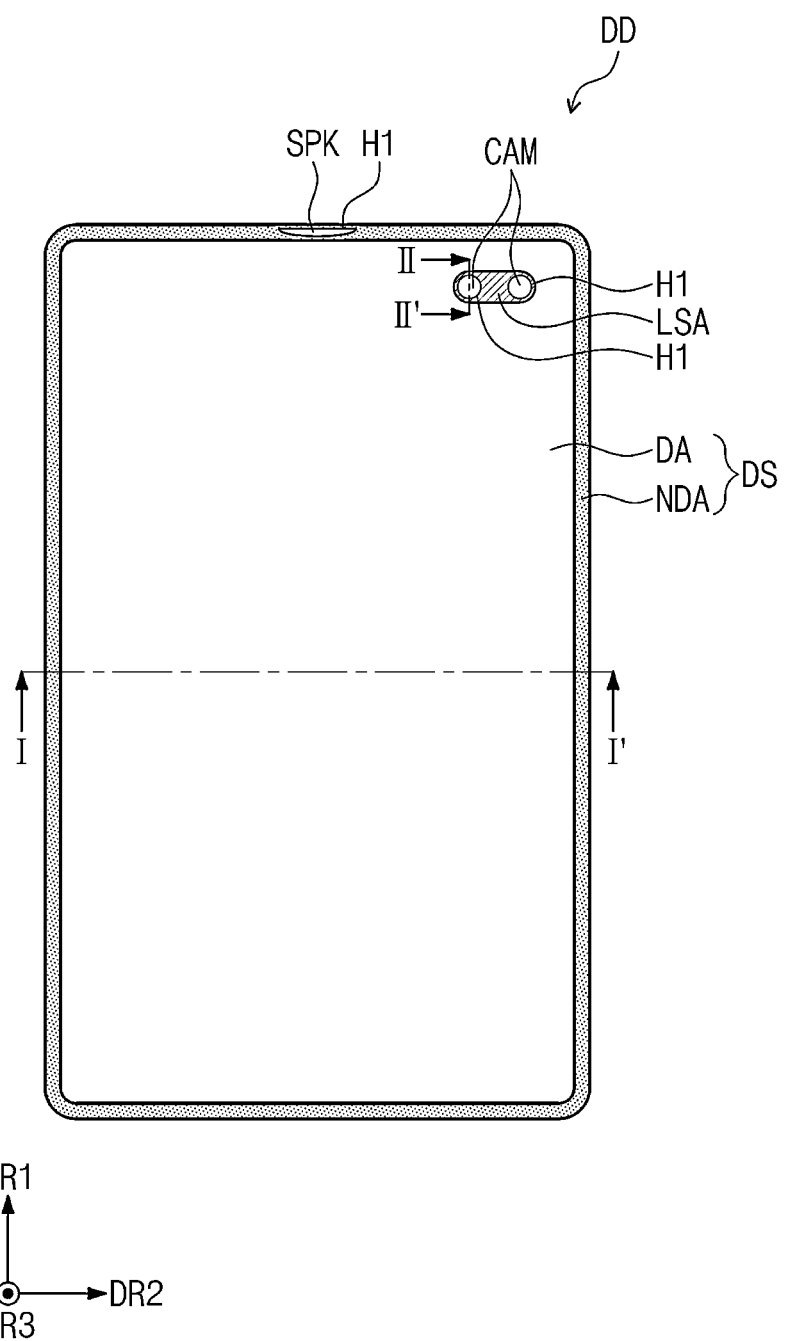
FIG. 1 is a plan view of an embodiment of a display device according to the invention.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the invention will be described in detail with reference to the accompanying drawings.

FIG. 1 is a plan view of an embodiment of a display device according to the invention.

Referring to FIG. 1, a display device DD may include a display area DA and a non-display area NDA that surrounds the display area DA and defines an edge of the display device DD. The display area DA may include a light blocking area LSA.

The light blocking area LSA may be disposed on a predetermined portion of the display area DA. The light blocking area LSA may be disposed on an upper end of the display device DD and a portion of the display area DA, which is adjacent to a right side of the display device DD, but the position of the light blocking area LSA is not limited thereto.

The display device DD may have a quadrangular (e.g., rectangular) shape having long sides in a first direction DR1 and short sides in a second direction DR2 crossing the first direction DR1. However, the invention is not limited thereto. In an embodiment, the display device DD may have various shapes such as a circular shape, a polygonal shape, and the like.

Hereinafter a direction substantially perpendicularly crossing a plane defined by the first and second directions DR1 and DR2 is defined as a third direction DR3. In this specification, the term "in the plan view" may mean a view from the third direction D3.

First holes H1 may be defined in the display device DD. The first holes H1 may be defined in the portions of the light blocking area LSA and the portion of the non-display area NDA. The display device DD may include a plurality of functional elements SPK and CAM disposed in the first holes H1.

The functional elements SPK and CAM may include a speaker SPK and cameras CAM. However, the invention is not limited thereto, and various functional elements (e.g., sensors) may be disposed in additional holes. The speaker SPK may be disposed in the non-display area NDA, and the cameras CAM may be disposed on the light blocking area LSA.

FIG. 1 illustrates an example in which the display device DD is a mobile phone. However, the display device DD may be used in small and medium-sized electronic devices such as personal computers, notebook computers, car navigation systems, game consoles, and tablets, as well as large-sized electronic devices such as televisions or external billboards. Also, the above-described devices are exemplified as merely an embodiment, and thus, the display device DD may be adopted for other electronic devices unless departing from the spirit and scope of the invention.

Figure 2:
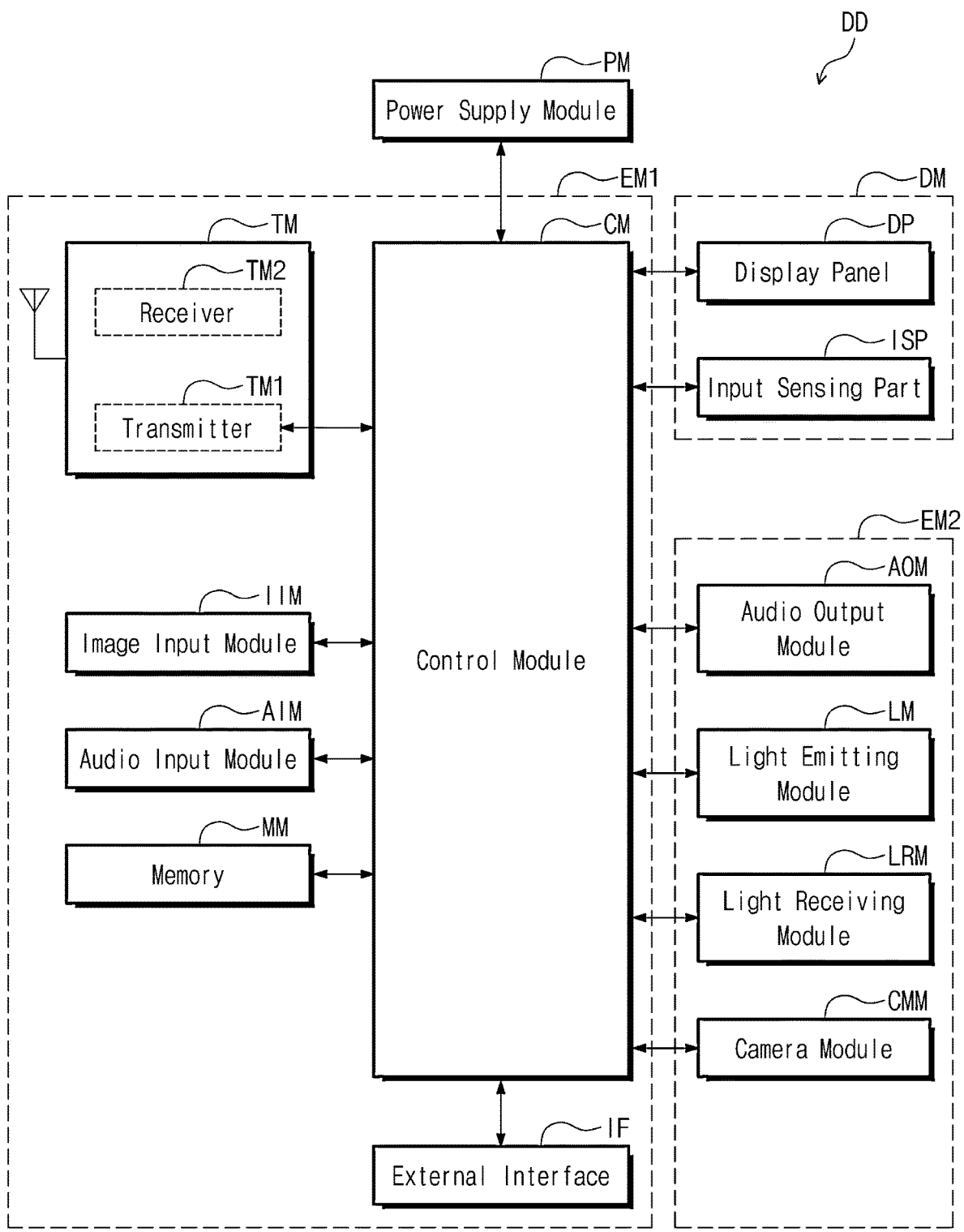
FIG. 2 is a block diagram of the display device of FIG. 1.

FIG. 2 is a block diagram of an embodiment of the display device of FIG. 1.

Referring to FIG. 2, the display device DD in an embodiment of the invention may include a display module DM, a power supply module PM, a first electronic module EM1, and a second electronic module EM2. The display module DM, the power supply module PM, the first electronic module EM1, and the second electronic module EM2 may be electrically connected to each other.

The power supply module PM may supply power desired for an overall operation of the display device DD. The power supply module PM may include a general battery module.

The first electronic module EM1 and the second electronic module EM2 may include various functional modules for driving the display device DD. The first electronic module EM1 may be directly disposed (e.g., mounted) on a main board electrically connected to the display module DM or may be disposed (e.g., mounted) on a separate board and electrically connected to the main board through a connector (not shown).

The first electronic module EM1 may include a control module CM, a wireless communication module TM, an image input module IIM, an audio input module AIM, a memory MM, and an external interface IF. A portion of the modules may not be disposed (e.g., mounted) on the main board but electrically connected to the main board through a flexible circuit board.

The control module CM may control an overall operation of the display device DD. The control module CM may activate or deactivate the display module DM. The control module CM may control other modules such as the image input module IIM or the audio input module AIM on the basis of a touch signal received from the display module DM.

In an embodiment, the wireless communication module TM may transmit/receive a wireless signal to/from the other terminal by Bluetooth or Wi-Fi line, for example. The wireless communication module TM may transmit/receive an audio signal by a general communication line. The wireless communication module TM may include a transmitter TM1 modulating and transmitting a signal to be transmitted and a receiver TM2 demodulating the received signal.

The image input module IIM may process the image signal to convert the processed image signal into image data that is capable of being displayed on the display module DM. The audio input module AIM may receive external audio signals by a microphone during recording mode or a voice recognition mode to convert the received audio signal into electrical sound data.

The external interface IF may serve as an interface connected to an external charger, a wired/wireless data port, and a card socket (e.g., a memory card and a subscriber identity module/user identity module ("SIM/UIM") card).

The second electronic module EM2 may include an audio output module AOM, a light emitting module LM, a light receiving module LRM, and a camera module CMM. The above-described constituents may be directly disposed (e.g., mounted) on the main board, may be disposed (e.g., mounted) on a separate board and electrically connected to the display module DM through a connector (not shown), or may be electrically connected to the first electronic module EM1.

The audio output module AOM may convert audio data received from the wireless communication module TM or audio data stored in the memory MM to output the converted audio data to the outside. The light emitting module LM may generate and output light. In an embodiment, the light emitting module LM may output infrared rays, for example. In an embodiment, the light emitting module LM may include a light emitting diode ("LED"), for example. In an embodiment, the light receiving module LRM may sense the infrared rays, for example. The light receiving module LRM may be activated when infrared rays having a predetermined level or more is sensed. In an embodiment, the light receiving module LRM may include a complementary metal-oxide-semiconductor ("CMOS") sensor, for example.

The infrared rays generated in the light emitting module LM may be outputted and then be reflected by an external object (e.g., a user's finger or face), and the reflected infrared rays may be incident into the light receiving module LRM. The camera module CMM may photograph an external image.

The display module DM includes a display panel DP and an input sensing part ISP. The display panel DP may display an image by the image data provided from the control module CM.

The input sensing part ISP may sense an external input (such as a user's hand or a touch pen), and the sensed signal may be converted into an input signal and then transmitted to the control module CM. The input sensing part ISP may sense an external input in a capacitive manner. The control module CM may control an operation of the display panel DP in response to an input signal of the input sensing part ISP.

Figure 3:
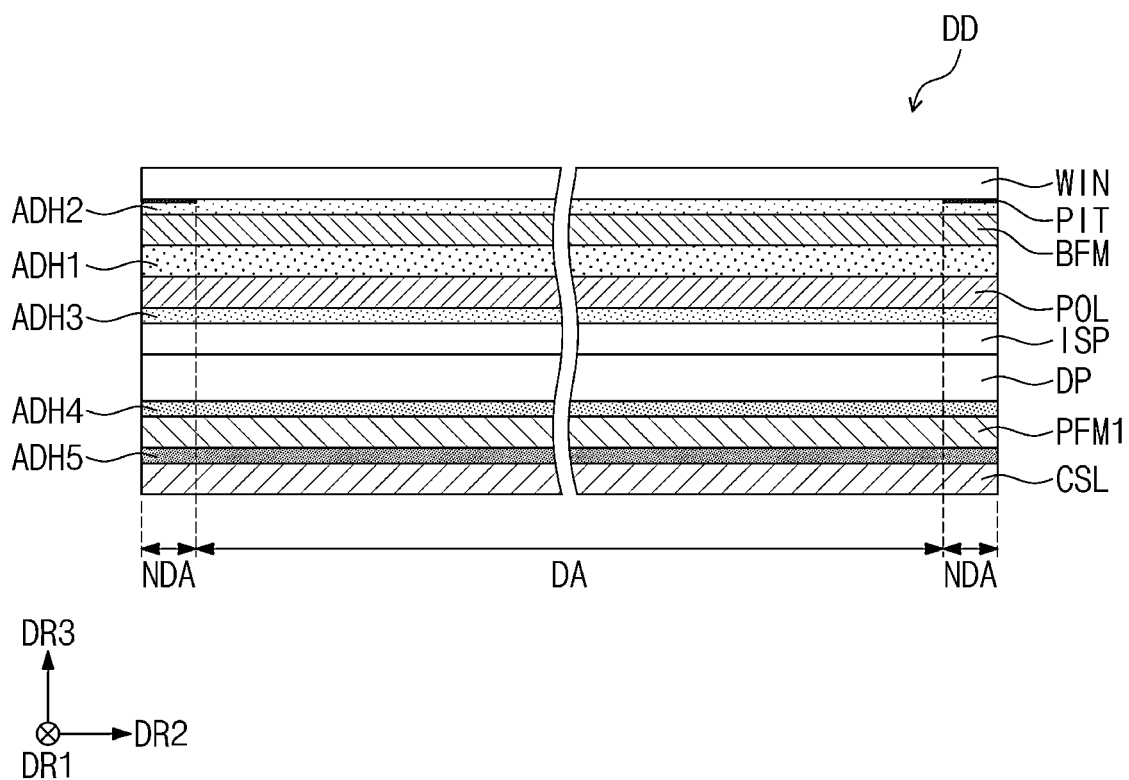
FIG. 3 is a cross-sectional view taken along line I-I' of FIG. 1.

FIG. 3 is a cross-sectional view taken along line I-I' of FIG. 1.

Referring to FIG. 3, the display device DD may include a display panel DP, an input sensing part ISP, a polarizing film POL, a base film BFM, a window WIN, a printing layer PIT, a first protective film PFM1, a cushion layer CSL, and first to fifth adhesives ADH1 to ADH5.

The input sensing part ISP, the polarizing film POL, the base film BFM, the window WIN, and the printing layer PIT may be disposed on the display panel DP. The first protective film PFM1 and the cushion layer CSL may be disposed below the display panel DP.

The display panel DP may include a display area DA and a non-display area NDA around the display area DA. The display panel DP may be a flexible display panel. In an embodiment, the display panel DP may include a plurality of electronic elements disposed on a flexible substrate, for example.

The display panel DP in an embodiment of the invention may be an emission type display panel, but is not limited thereto. In an embodiment, the display panel DP may be an organic light emitting display panel or a quantum dot light emitting display panel, for example. A light emitting layer of the organic light emitting display panel may include an organic light emitting material. A light emitting layer of the quantum dot light emitting display panel may include a quantum dot, a quantum rod, and the like. Hereinafter, the display panel DP is described as an organic light emitting display panel.

The input sensing part ISP may be disposed on the display panel DP. The input sensing part ISP may include a plurality of sensing parts (not shown) for sensing an external input. The sensing portions may sense the external input in a capacitive manner. The input sensing part ISP may be directly manufactured on display panel DP when the display panel DP is manufactured. However, the invention is not limited thereto, and the input sensing part ISP may be provided as a panel that is manufactured to be separated from the display panel DP and then may be attached to the display panel DP by an adhesive.

The polarizing film POL may be disposed on the input sensing part ISP. The polarizing film POL may be defined as an external light anti-reflection film. The polarizing film POL may reduce reflectance of external light incident from the display device DD onto the display panel DP. In an embodiment, the polarizing film POL may include a phase retarder and/or a polarizer, for example.

The base film BFM may be disposed on the polarizing film POL. The base film BFM may include a flexible plastic substrate. In an embodiment, the base film BFM may include polyethylene terephthalate ("PET"), for example.

The window WIN may be disposed on the base film BFM. The window WIN may protect the display panel DP, the input sensing part ISP, and the polarizing film POL from external scratches and impacts. An image generated in the display panel DP may pass through the window WIN and then be provided to the user.

The first protective film PFM1 may be disposed below the display panel DP. The first protective film PFM1 may be defined as a protective substrate. The first protective film PFM1 may protect a lower portion of the display panel DP. The first protective film PFM1 may include a flexible plastic substrate. In an embodiment, the first protective film PFM1 may include PET, for example.

The cushion layer CSL may be disposed below the first protective film PFM1. The cushion layer CSL may absorb an external impact applied to a lower portion of the display module DM to protect the display panel DP. The cushion layer CSL may include a foam sheet having predetermined elastic force.

The printing layer PIT may overlap the non-display area NDA and may be disposed on a bottom surface of the window WIN facing the base film BFM. The printing layer PIT may not be disposed on the display area DA. In an embodiment, the printing layer PIT may have a predetermined color, for example, have a black color. The non-display area NDA may be printed with a predetermined color by the printing layer PIT.

The first adhesive ADH1 may be disposed between the display panel DP and the base film BFM. Specifically, the first adhesive ADH1 may be disposed between the polarizing film POL and the base film BFM. The polarizing film POL and the base film BFM may be bonded to each other by the first adhesive ADH1.

The second adhesive ADH2 may be disposed between the window WIN and the base film BFM. The second adhesive ADH2 may be disposed on the bottom surface of the window WIN to cover the printing layer PIT. The window WIN and the base film BFM may be bonded to each other by the second adhesive ADH2.

The third adhesive ADH3 may be disposed between the polarizing film POL and the input sensing part ISP. The polarizing film POL and the input sensing part ISP may be bonded to each other by the third adhesive ADH3.

The fourth adhesive ADH4 may be disposed between the display panel DP and the first protective film PFM1. The display panel DP and the first protective film PFM1 may be bonded to each other by the fourth adhesive ADH4.

The fifth adhesive ADH5 may be disposed between the first protective film PFM1 and the cushion layer CSL. The first protective film PFM1 and the cushion layer CSL may be bonded to each other by the fifth adhesive ADH5.

The first adhesive ADH1 may have a thickness greater than that of each of the second, third, fourth, and fifth adhesives ADH2, ADH3, ADH4, and ADH5 in the third direction DR3 perpendicular to the plane of the display panel DP. The first adhesive ADH1 may include an optical clear adhesive. Each of the second, third, fourth, and fifth adhesives ADH2, ADH3, ADH4, and ADH5 may include a pressure sensitive adhesive.

Figure 4:
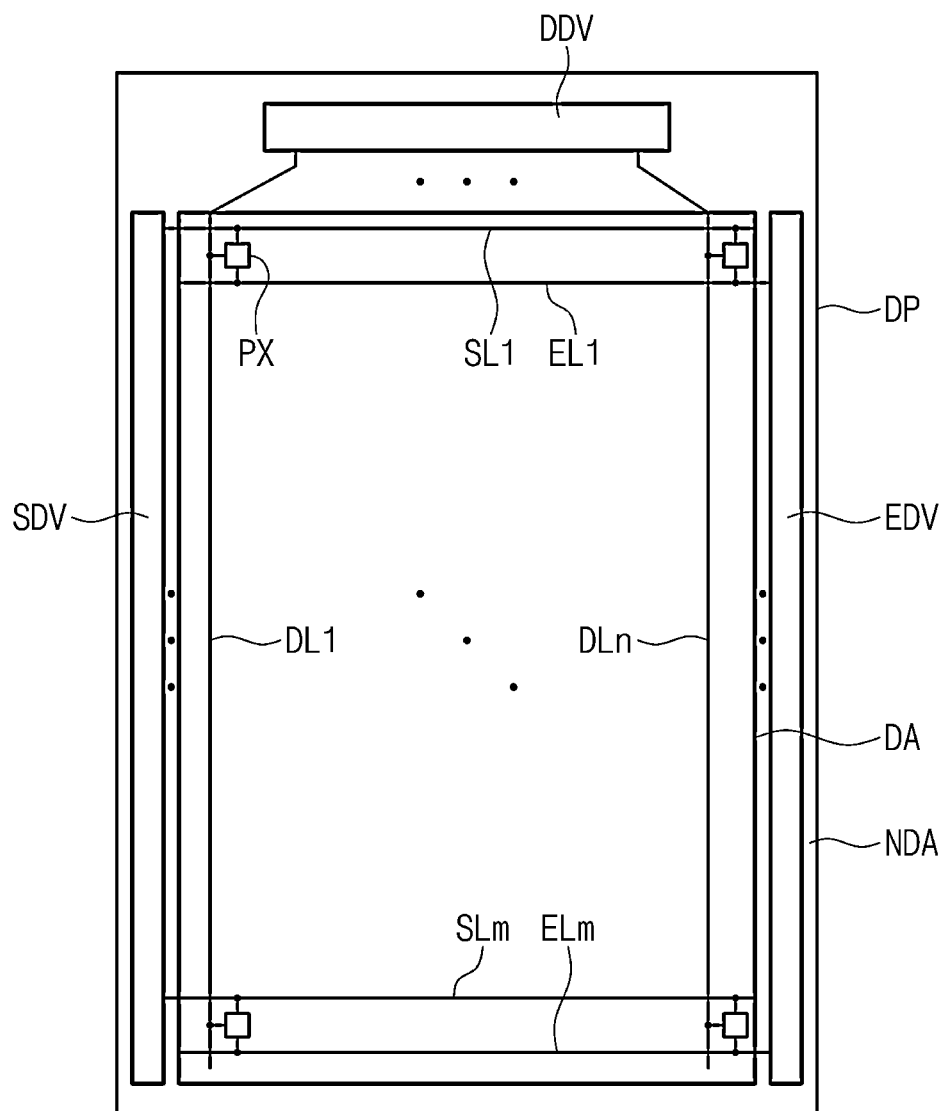
FIG. 4 is a plan view of the display panel of FIG. 3.

FIG. 4 is a plan view of the display panel of FIG. 3.

Referring to FIG. 4, the display device DD in an embodiment of the invention may include a display panel DP, a scan driver SDV, a data driver DDV, and an emission driver EDV.

The display panel DP may have a quadrangular (e.g., rectangular) shape having long sides, which are adjacent to each other in the first direction DR1, and short sides, which are adjacent to each other in the second direction DR2. The display panel DP may include a display area DA and a non-display area NDA surrounding the display area DA.

The display panel DP may include a plurality of pixels PX, a plurality of scan lines SL1 to SLm, a plurality of data lines DL1 to DLn, and a plurality of emission lines EL1 to ELm. Here, m and n are natural numbers. The pixels PX may be disposed on the display area DA and connected to the scan lines SL1 to SLm, the data lines DL1 to DLn, and the emission lines EL1 to ELm.

The scan driver SDV, the data driver DDV, and the emission driver EDV may be disposed on the non-display area NDA. The scan driver SDV and the emission driver EDV may be disposed adjacent to the long sides of the display panel DP, respectively.

The data driver DDV may be manufactured in the form of an integrated circuit chip and disposed adjacent to one short side of the display panel DP. However, the invention is not limited thereto, and the data driver DDV may be disposed (e.g., mounted) on a flexible circuit board (not shown) and connected to the display panel DP through the flexible circuit board.

The scan lines SL1 to SLm may extend in the second direction DR2 and be connected to the scan driver SDV. The data lines DL1 to DLn may extend in the first direction DR1 and be connected to the data driver DDV. The emission lines EL1 to ELm may extend in the second direction DR2 and be connected to the emission driver EDV.

The scan driver SDV may generate a plurality of scan signals, and the scan signals may be applied to the pixels PX through the scan lines SL1 to SLm. The scan signals may be sequentially applied to the pixel PX. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

Although not shown, the display device DD may include a timing controller (not shown) that controls operations of the scan driver SDV, the data driver DDV, and the emission driver EDV.

The pixels PX may receive the data voltages in response to the scan signals. The pixels PX may emit light having luminance corresponding the data voltages in response to the emission signals to display an image. An emission time of the pixels PX may be controlled by the emission signals.

Figure 5:
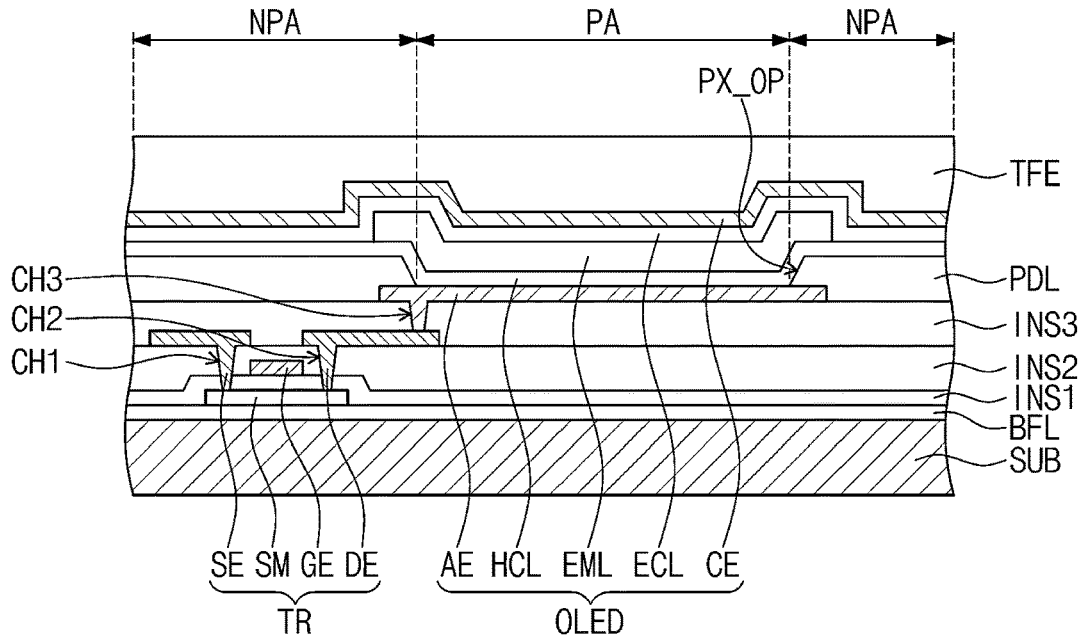
FIG. 5 is a schematic cross-sectional view illustrating a configuration of one pixel of FIG. 4.

FIG. 5 is a schematic cross-sectional view illustrating a configuration of one pixel of FIG. 4.

Referring to FIG. 5, the pixel PX may include the light emitting element OLED and the transistor TR connected to the light emitting element OLED. The light emitting element OLED may include a first electrode AE, a second electrode CE, a hole control layer HCL, an electron control layer ECL, and a light emitting layer EML. In an embodiment, the first electrode AE may be an anode electrode, and the second electrode CE may be a cathode electrode, for example.

The transistor TR and the light emitting element OLED may be disposed on the substrate SUB. The substrate SUB may include a light emitting area corresponding to each of the pixels PX and a non-light emitting area around the light emitting area. The light emitting element OLED may be disposed on the light emitting area, and the transistor TR may be disposed on the non-light emitting area. A buffer layer BFL may be disposed on the substrate SUB, and the buffer layer may include an inorganic material.

The semiconductor layer SM of the transistor TR may be disposed on the buffer layer BFL. The semiconductor layer SM may include a semiconductor or an organic semiconductor that includes an inorganic material such as amorphous silicon or polycrystalline silicon. Also, the semiconductor layer SM may include an oxide semiconductor. Although not shown in FIG. 5, the semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. A gate electrode GE of the transistor TR overlapping the semiconductor layer SM may be disposed on the first insulation layer INS1. The gate electrode GE may be disposed to overlap a channel region of the semiconductor layer SM.

A second insulation layer INS2 may be disposed on the first insulation layer INS1 to cover the gate electrode GE. The second insulation layer INS2 may include an organic material and/or an inorganic material.

The source electrode SE and the drain electrode DE of the transistor TR may be disposed to be spaced apart from each other on the second insulation layer INS2. The source electrode SE may be connected to the source region of the semiconductor layer SM through a first contact hole CH1 that is defined in each of the first and second insulation layers INS1 and INS2. The drain electrode DE may be connected to the drain region of the semiconductor layer SM through a second contact hole CH2 that is defined in each of the first and second insulation layers INS1 and INS2.

A third insulation layer INS3 may be disposed on the second insulation layer INS2 to cover the source and drain electrodes SE and DE of the transistor TR. The third insulation layer INS3 may be defined as a planarization layer that provides a flat top surface and include an organic material.

The first electrode AE may be disposed on the third insulation layer INS3. The first electrode AE may be connected to the drain electrode DE of the transistor TR through a third contact hole H3 that is defined in the third insulation layer INS3.

A pixel defining layer PDL through which a predetermined area of the first electrode AE is exposed may be disposed on the first electrode AE and the third insulation layer INS3. An opening PX_OP through which a predetermined portion of the first electrode AE is exposed may be defined in the pixel defining layer PDL.

The hole control layer HCL may be disposed on the first electrode AE and the pixel defining layer PDL. A hole control layer HCL may be commonly disposed on the light emitting area and the non-light emitting area. The hole control layer HCL may include a hole transport layer and may further include a hole injection layer.

The light emitting layer EML may be disposed on the hole control layer HCL. The light emitting layer EML may be disposed on an area corresponding to the opening PX_OP. That is, the light emitting layer EML may be separated from each of the pixels PX. Also, the light emitting layer EML may include an organic material and/or an inorganic material. The light emitting layer EML may emit one of red light, green light, and blue light. However, the invention is not limited thereto. In an embodiment, the light emitting layer EML may generate white light by the combination of organic materials that respectively generate red, green, and blue light, for example.

The electron control layer ECL may be disposed on the light emitting layer EML. The electron control layer ECL may be disposed on the hole control layer HCL to cover the light emitting layer EML. A hole control layer HCL may be commonly disposed on the light emitting area and the non-light emitting area. The electron control layer ECL may include an electron transport layer and may further include an electron injection layer.

The second electrode CE may be disposed on the electron control layer ECL. The second electrode CE may be commonly disposed in the pixels PX. The thin film encapsulation layer TFE may be disposed on the second electrode CE. The thin film encapsulation layer TFE may cover the pixel PX.

A first voltage may be applied to the first electrode AE, and a second voltage having a level lower than that of the first voltage may be applied to the second electrode CE. Holes and electrons injected into the light emitting layer EML may be coupled to each other to form exciton. While the exciton may be transitioned to a ground state, the light emitting element OLED may emit light. The light emitting element OLED may emit light to display an image.

Figure 6:
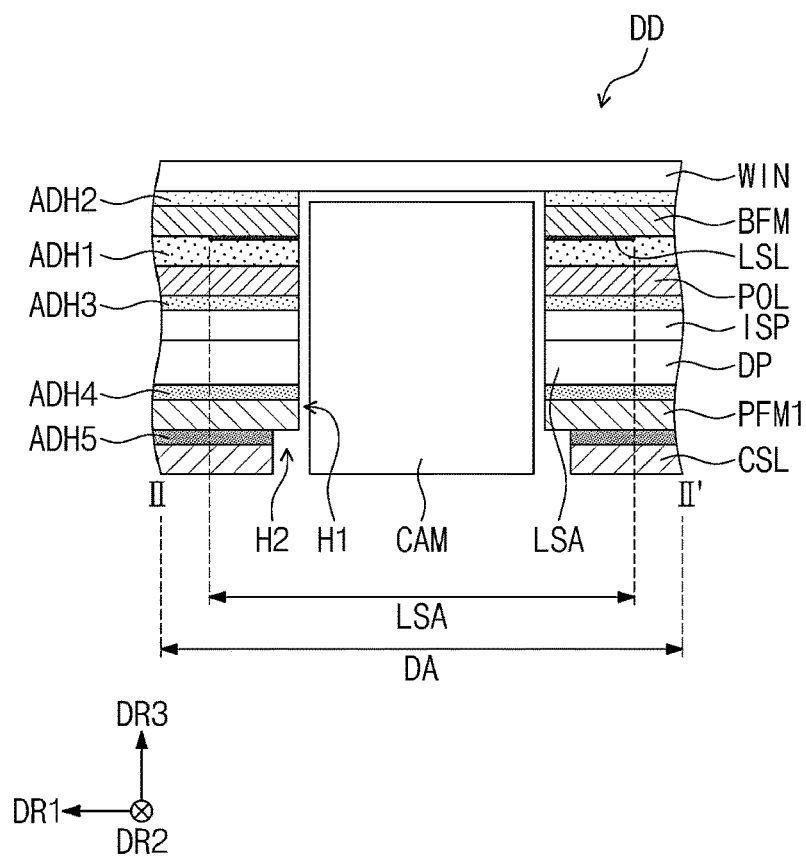
FIG. 6 is a cross-sectional view taken along line II-II' of FIG. 1.

FIG. 6 is a cross-sectional view taken along line II-II' of FIG. 1.

Referring to FIG. 6, a lamination structure from the cushion layer CSL to the window WIN is the same as that from the cushion layer CSL to the window WIN, which is described with reference to FIG. 3. The display area DA of the display panel DP may include a light blocking area LSA.

The display device DD may include a light blocking layer LSL overlapping the light blocking area LSA and disposed on one surface of the base film BFM. One surface of the base film BFM may be defined as a bottom surface of the base film BFM facing the display panel DP. That is, the light blocking layer LSL may be disposed on the bottom surface of the base film BFM. The light blocking layer LSL may block light. In an embodiment, the light blocking layer LSL may have a black color, for example.

A first hole H1 may be defined in a portion of the light blocking area LSA of the display panel DP. The first hole H1 defined in the display panel DP may be defined by passing through the base film BFM, the light blocking layer LSL, the first adhesive ADH1, and the second adhesive ADH2. In addition, the first hole H1 may be defined by passing through the input sensing part ISP, the polarizing film POL, the first protective film PFM1, and the third and fourth adhesives ADH3 and ADH4. A camera CAM may be disposed in the first hole H1 as a functional element.

An inner surface of the light blocking area LSA in which the first hole H1 is defined, an inner surface of the base film BFM in which the first hole H1 is defined, an inner surface of the light blocking layer LSL in which the first hole H1 is defined, an inner surface of the first adhesive ADH1 in which the first hole H1 is defined, and an inner surface of the second adhesive ADH2 in which the first hole H1 is defined may be disposed on the same surface.

In addition, an inner surface of the light blocking area LSA in which the first hole H1 is defined, an inner surface of the input sensing part ISP in which the first hole H1 is defined, an inner surface of the polarizing film POL in which the first hole H1 is defined, inner surfaces of the third and fourth adhesives ADH3 and ADH4 in which the first holes H1 are defined, and an inner surfaces of the first protective film PFM1 in which the first hole H1 is defined may be disposed on the same surface.

Therefore, in the portion where the first hole H1 is defined, the inner surface of the light blocking area LSA, the inner surface of the base film BFM, the inner surface of the light blocking layer LSL, the inner surface of the first adhesive ADH1, the inner surface of the second adhesive ADH2, the inner surface of the input sensing part ISP, the inner surface of the polarizing film POL, the inner surfaces of the third and fourth adhesives ADH3 to ADH4, and the inner surface of the first protective film PFM1 may be continuous to define the same plane.

A second hole H2 overlapping the first hole H1 and greater than the first hole H1 in the plan view may be defined in the cushion layer CSL and the fifth adhesive ADH5. A camera CAM may be disposed as a functional element in each of the first hole H1 and the second hole H2.

Figure 7:
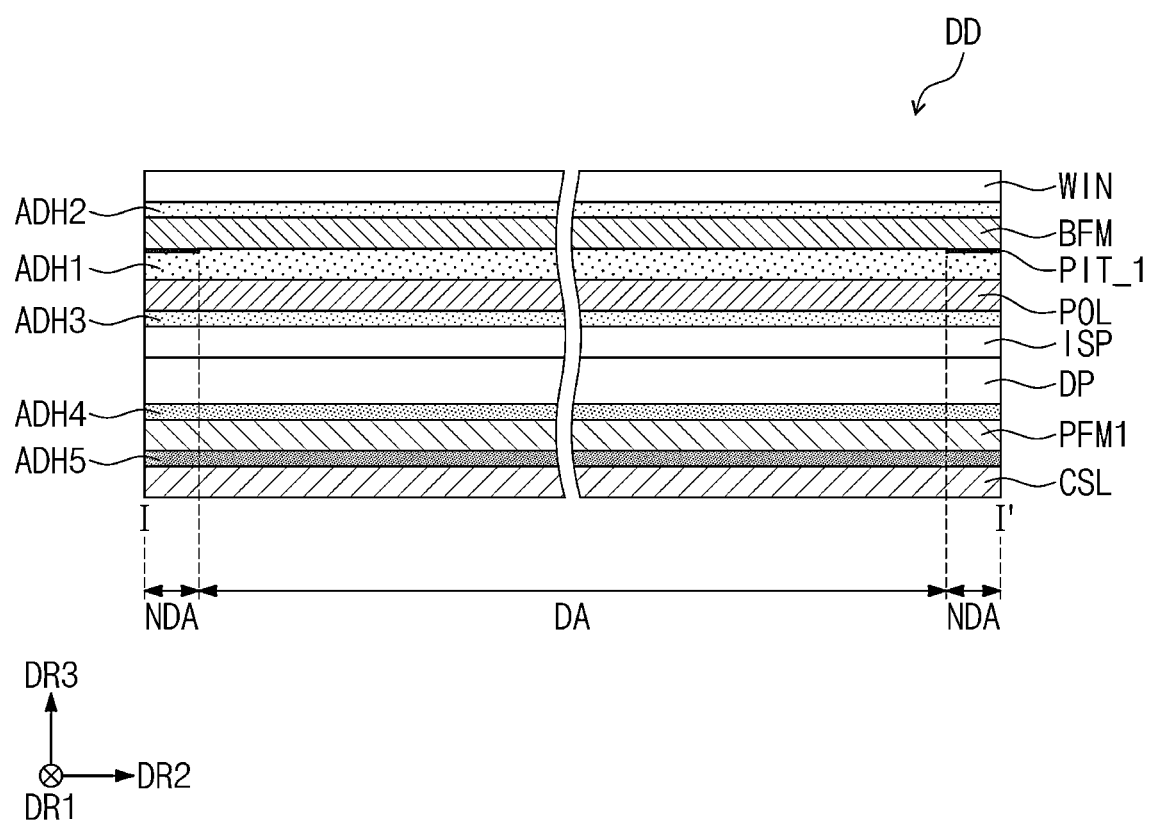
FIG. 7 is a view illustrating an embodiment of an arranged position of a printing layer according to the invention.

FIG. 7 is a view illustrating an embodiment of an arranged position of the printing layer according to the invention.

For convenience of description, FIG. 7 illustrates a cross-sectional view corresponding to the cross-section view of FIG. 3.

Referring to FIG. 7, a printing layer PIT_1 may be disposed in the same layer as the light blocking layer LSL. In an embodiment, the printing layer PIT of FIG. 3 may be disposed on the bottom surface of the window WIN, for example, but the printing layer PIT_1 of FIG. 7 may be disposed on one surface of the base film BFM, like the light blocking layer LSL. In an embodiment, the printing layer PIT_1 may overlap the non-display area NDA and be disposed on the bottom surface of the base film BFM, for example.

The configurations of the other layers of FIG. 7 are substantially the same as those of the layers of FIG. 3, and thus descriptions thereof are omitted.

FIG. 8A to 8E are views for explaining an embodiment of a method for manufacturing a display device according to the invention.

FIGS. 8A to 8E illustrate cross-sectional views corresponding to FIG. 6, for example. FIG. 6 will be described together as desired for the description below.

Figure 8A:
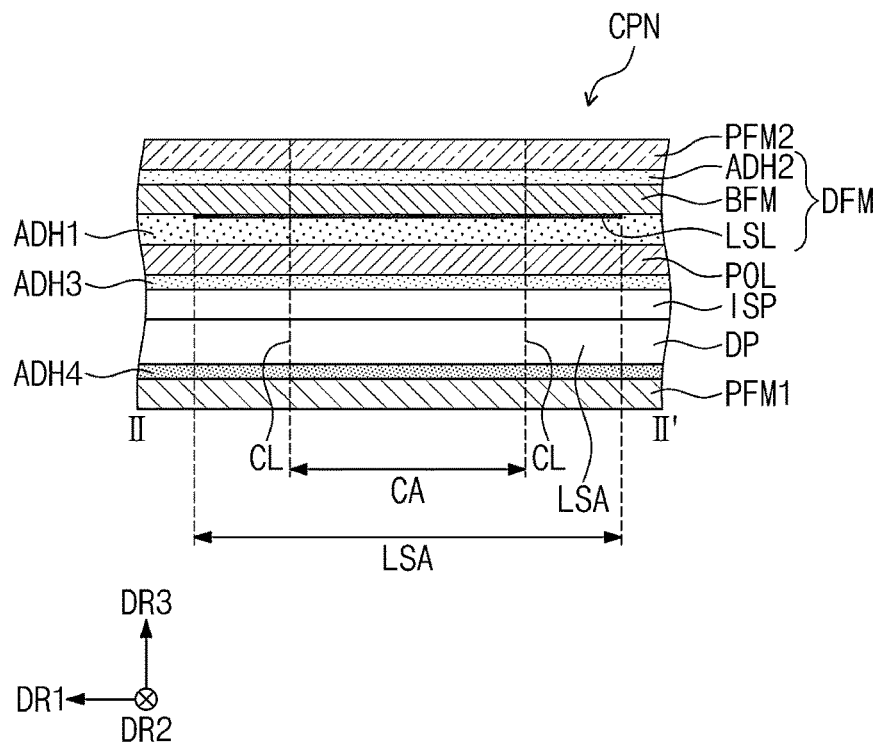
FIG. 8A to 8E are views for explaining an embodiment of a method for manufacturing a display device according to the invention.

Referring to FIG. 8A, a panel CPN may be prepared. The panel CPN includes a display panel DP, an input sensing part ISP, a polarizing film POL, a deco film DFM, a first protective film PFM1, a second protective film PFM2, and first, third, and fourth adhesives ADH1, ADH3, and ADH4. The decor film DFM may include a base film BFM, a light blocking layer LSL, and a second adhesive ADH2.

The lamination structure from the first protective film PFM1 to the second adhesive ADH2 is substantially the same as that of FIG. 6. The deco film DFM may be disposed on the first adhesive ADH1, the second protective film PFM2 may be disposed on the deco film DFM. The second protective film PFM2 may be disposed on the second adhesive ADH2 of the decor film DFM. Thus, the second adhesive ADH2 may be disposed between the base film BFM and the second protective film PFM2.

The second protective film PFM2 may include PET. That is, the second protective film PFM2 may include the same material as that of the first protective film PFM1. The first protective film PFM1 may define a lower portion of the panel CPN, and the second protective film PFM2 may define an upper portion of the panel CPN.

A cutoff area CA overlapping the first hole H1 illustrated in FIG. 6 may be defined in the panel CPN. The cutoff area CA may be provided as a cutoff line CL having a closed curve. The closed curve may be defined as a boundary of the first hole H1 in which the camera CAM of FIG. 1 is disposed. Thus, in the plan view, the cutoff area CA may overlap the light blocking area LSA and may have a surface area less than that of the light blocking area LSA.

Figure 8B:
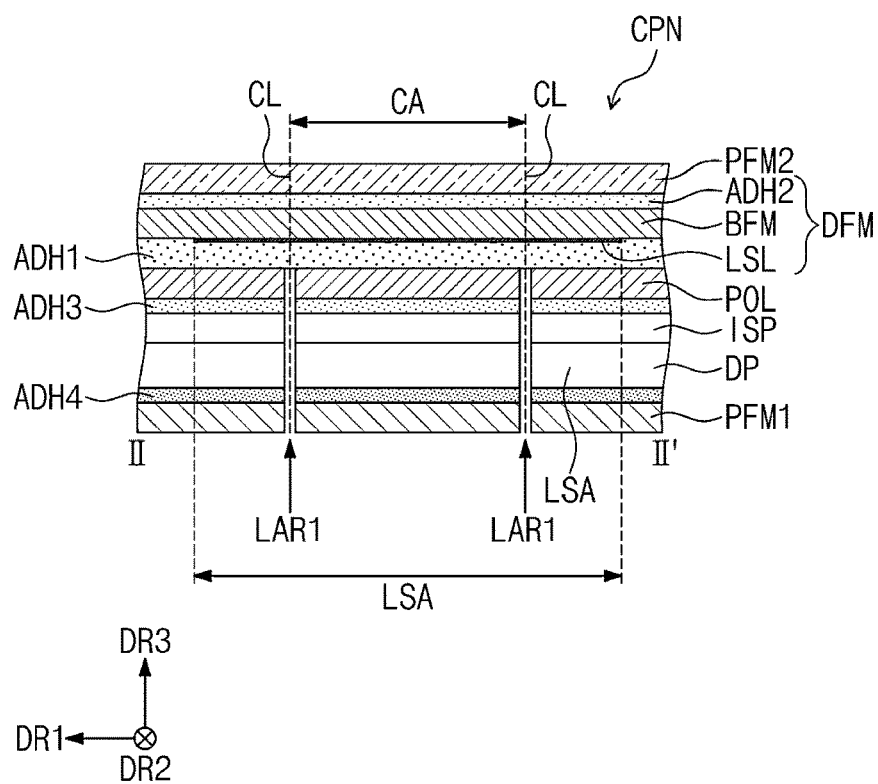

Referring to FIG. 8B, intense light (e.g., laser light) may be provided to the cutoff line CL of the panel CPN to cut the cutoff area CA. Various lasers such as nano lasers, pico lasers, femtosecond lasers, and ultraviolet ("UV") lasers may be used as lasers (or laser generators) for generating the laser light.

Specifically, first laser light LAR1 may be irradiated from a lower side of the first protective film PFM1 toward the panel CPN. The first laser light LAR1 may be irradiated toward the cutoff line CL. Portions of the first protective film PFM1, the fourth adhesive ADH4, the display panel DP, the input sensing part ISP, the third adhesive ADH3, and the polarizing film POL, which overlap the cutoff area CA, may be cut by the first laser light LAR1. That is, the portion of the panel CPN below the first adhesive ADH1 may be cut by the first laser light LAR1.

The first laser light LAR1 may be provided to the panel CPN at least one time, preferably plural times, to cut a plurality of layers. Here, the plurality of layers may include layers from the first protective film PFM1 to the polarizing film POL. A focus of the first laser light LAR1 may be provided from a bottom surface of the panel CPN toward the inside of the panel CPN, and a portion of the panel CPN may be cut by heat of the first laser light LAR1.

Figure 8C:
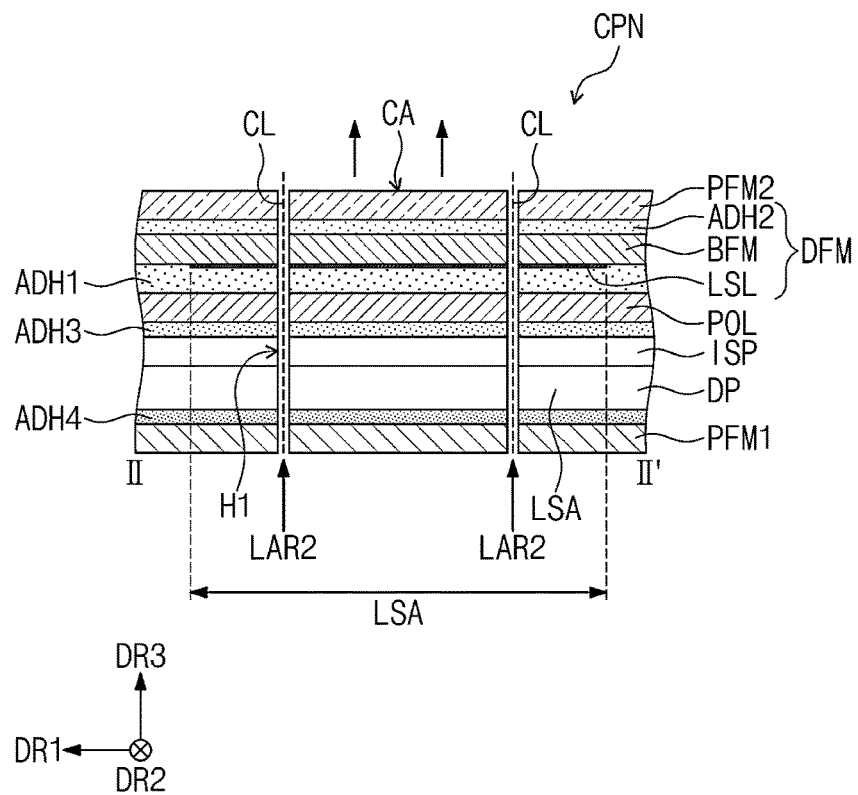

Referring to FIG. 8C, second laser light LAR2 may be irradiated from a lower side of the first protective film PFM1 toward the panel CPN. The second laser light LAR2 may be irradiated toward the cutoff line CL. Portions of the first adhesive ADH1, the decor film DFM, and the second protective film PFM2, which overlap the cutoff area CA, may be cut by the second laser light LAR2.

The second laser light LAR2 may be provided to the panel CPN at least one time, preferably plural times, to cut a plurality of layers. Here, the plurality of layers may include a first adhesive ADH1, a base film BFM, a light blocking layer LSL, a second adhesive ADH2, and a second protective film PFM2.

A focus of the second laser light LAR2 may be provided on a portion of the panel CPN to be cut so that the portion of the panel CPN is cut. The second laser light LAR2 may have power higher than the first laser light LAR1. In an embodiment, the second laser light LAR2 may have power greater about 1.5 times to about 10 times than that of the first laser light LAR1, for example. In an embodiment, the power of the first and second laser light LAR1 and LAR2 may be set to a value between about 0.2 watt (W) and about 60 W, for example. In an embodiment, the first laser light LAR1 may have power of about 10 W or less, and the second laser light LAR2 may have power of about 15 W or more, for example.

The cutoff line CL may be cut through the first and second laser light LAR1 and LAR2, and the cutoff area CA may be separated and removed from the panel CPN. As a result, a first hole H1 may be defined in the panel CPN.

The first adhesive ADH1 including an optical clear adhesive and thicker than each of other adhesives ADH2 to ADH5 may not be cut by the first laser light LAR1 having lower energy. Thus, the second laser light LAR2 having higher energy may be used to cut the first adhesive ADH1.

In an embodiment of the invention, the layers from the first protective film PFM1 to the polarizing film POL, which are capable of being more easily cut, may be cut through first laser light LAR1 having lower energy. Also, the first adhesive ADH1 that is difficult to be cut may be cut through the second laser light LAR2 having higher energy. Thus, a process for cutting the panel CPN may be performed more easily.

The quality of the cut surface may vary depending on light absorption of the first and second protective films PFM1 and PFM2 and the first adhesive ADH1 during the cutting process. The quality of the cut surface may be defined as roughness of the cut surface. The higher the light absorption of the first adhesive ADH1, and the lower the light absorption of each of the first and second protective films PFM1 and PFM2, the better the quality of the cut surface.

In an embodiment of the invention, the light absorption of each of the first and second protective films PFM1 and PFM2 may be set to be less than or equal to about 50 percent (%). In an embodiment, the light absorption of the first adhesive ADH1 may be set to be greater than or equal to about 15%, for example.

Although not shown, a first laser for generating the first laser light LAR1 and a second laser for generating the second laser light LAR2 may be used. However, the invention is not limited thereto, and thus one laser may be used. In an embodiment, the first laser light LAR1 and the second laser light LAR2, which have different intensities, may be generated in one laser and then irradiated to the panel CPN, for example.

Figure 8D:
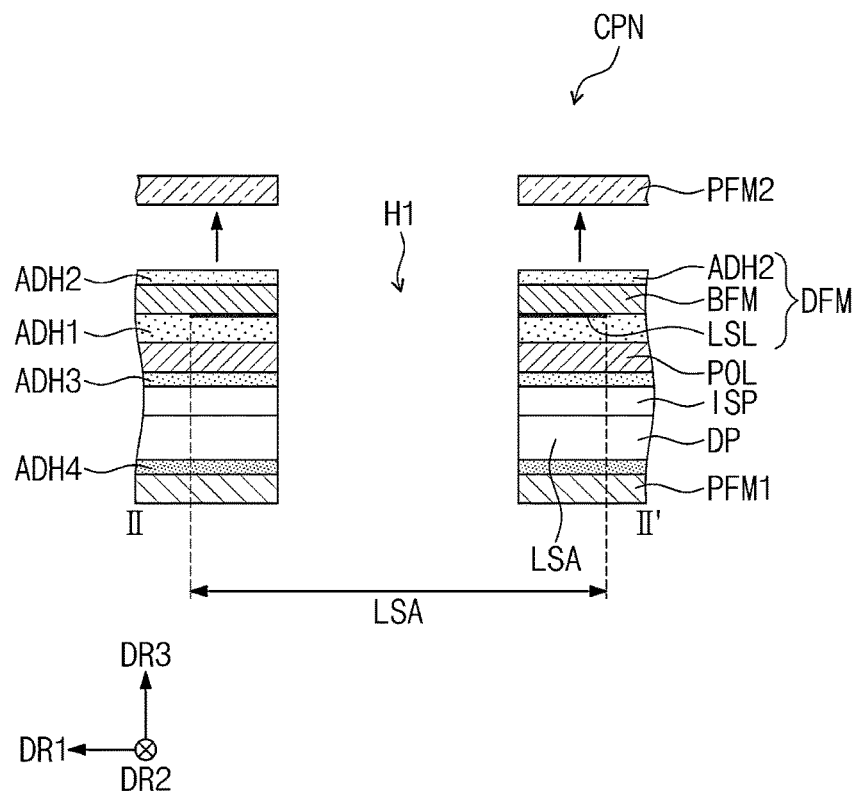
Figure 8E:
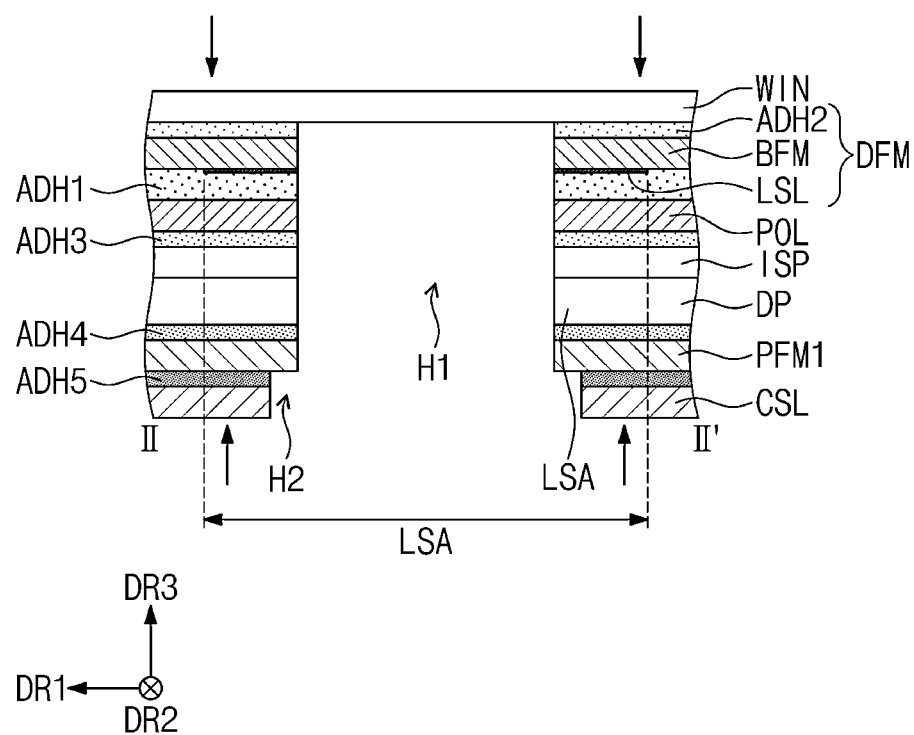

Referring to FIGS. 8D and 8E, the second protective film PFM2 may be removed from the panel CPN. A window WIN may be provided on the second adhesive ADH2, and a fifth adhesive ADH5 and a cushion layer CSL may be provided below the first protective film PFM1. As described above, a second hole H2 larger than the first hole H1 may be defined in the fifth adhesive ADH5 and the cushion layer CSL.

The window WIN may be attached to the base film BFM by the second adhesive ADH2. The cushion layer CSL may be attached to the first protective film PFM1 by the fifth adhesive ADH5. Thereafter, as illustrated in FIG. 6, the camera CAM may be disposed in the first hole H1 and the second hole H2 to manufacture the display device DD. In an embodiment, although a method for defined one first hole H1 has been described, other first holes H1 of FIG. 1 may also be defined in the same manner as described in FIGS. 8A to 8E, for example.

In an embodiment of the invention, a deco film DFM may be disposed on the panel CPN, and the deco film DFM may include a light blocking layer LSL disposed on one surface of the base film BFM. Also, the first hole H1 may be defined in the panel CPN through the first and second laser light LAR1 and LAR2. As a result, since the first hole H1 defined in the light blocking layer LSL and the first holes H1 defined in other layers may be defined at the same time, the first hole H1 may match with each other. Also, since the window WIN is separately attached, the laser light may not be provided to the window to prevent the display device DD from being damaged.

Figure 9:
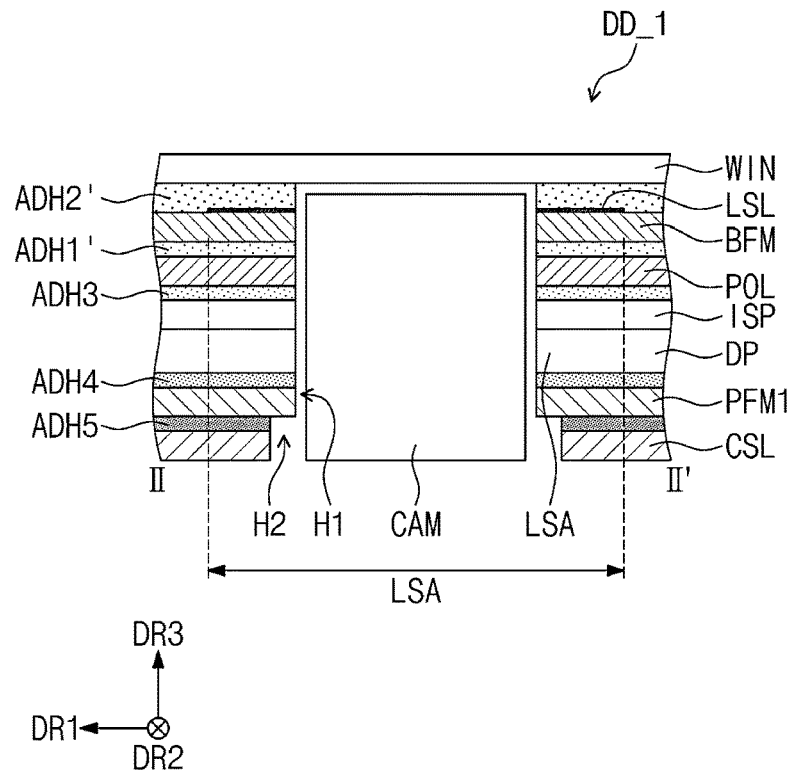
FIG. 9 is a cross-sectional view illustrating another embodiment of a configuration of a display device according to the invention.

FIG. 9 is a cross-sectional view illustrating another embodiment of a configuration of a display device according to the invention.

In an embodiment, FIG. 9 illustrates a cross-sectional view corresponding to the cross-section view of FIG. 6, for example. Hereinafter, a lamination structure of a display device DD_1 will be described based on a configuration different from that illustrated in FIG. 6. Also, the same configuration is illustrated using the same reference symbol.

Referring to FIG. 9, a first adhesive ADH1' may be disposed between a polarizing film POL and a base film BFM, and a second adhesive ADH2' may be disposed between a window WIN and the base film BFM. A light blocking layer LSL may overlap a light blocking area LSA and may be disposed on one surface of the base film BFM. The one surface of the base film BFM may be a top surface of the base film BFM facing the window WIN. That is, the light blocking layer LSL may be disposed on the top surface of the base film BFM.

The second adhesive ADH2' may have a thickness greater than that of the first adhesive ADH1' in the third direction DR3. The second adhesive ADH2' may include an optical clear adhesive, and the first adhesive ADH1' may include a pressure sensitive adhesive. That is, the second adhesive ADH2' illustrated in FIG. 9 may have the same configuration as the first adhesive ADH1 illustrated in FIG. 6, and the first adhesive ADH1' illustrated in FIG. 9 may have the same configuration as the second adhesive ADH2 illustrated in 6.

The structures of the first hole H1 and the second hole H2 may be substantially the same as the first hole H1 and the second hole H2, which are illustrated in FIG. 6.

Figure 10:
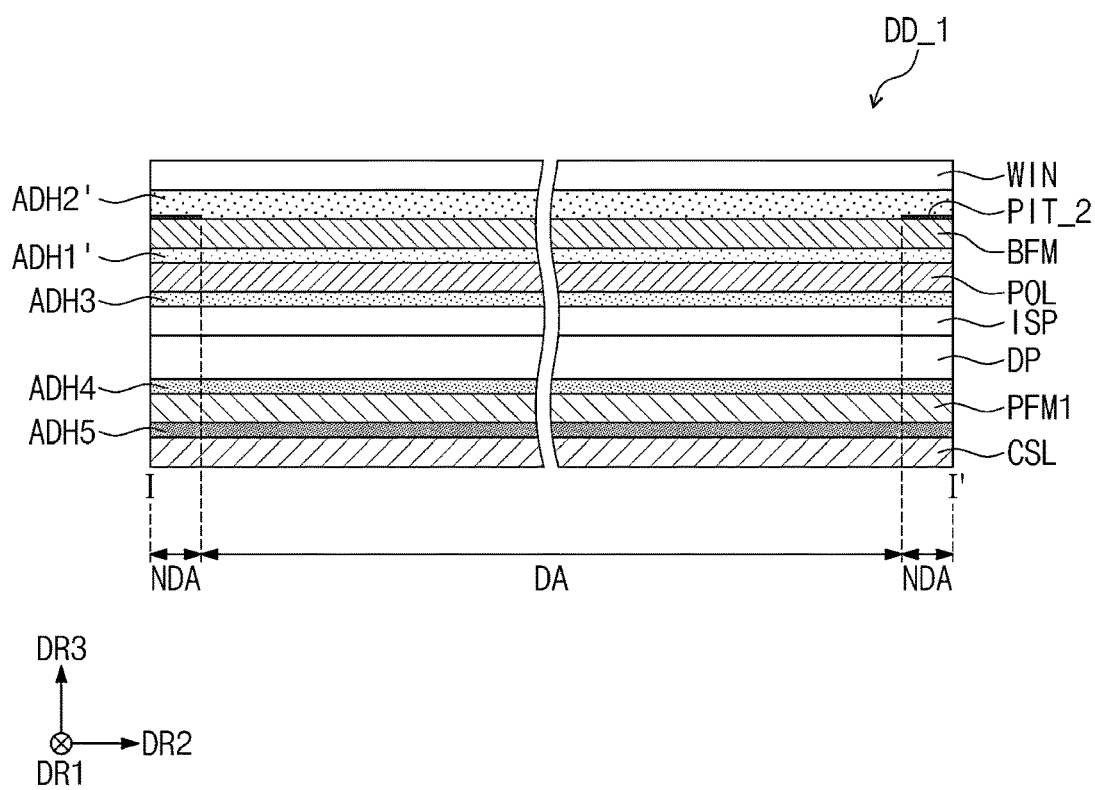
FIG. 10 is a view illustrating an embodiment of an arranged position of a printing layer according to the invention.

FIG. 10 is a view illustrating an embodiment of an arranged position of a printing layer according to the invention.

For convenience of description, FIG. 10 illustrates a cross-sectional view corresponding to the cross-section view of FIG. 9.

Referring to FIG. 10, a printing layer PIT_2 may overlap a non-display area NDA and may be disposed in the same layer as the light blocking layer LSL. In an embodiment, the printing layer PIT_2 may be disposed on the top surface of the base film BFM, like the light blocking layer LSL, for example.

FIG. 11A to 11E are views for explaining another embodiment of a method for manufacturing the display device of FIG. 9 according to the invention.

In an embodiment, FIGS. 11A to 11E are cross-sectional views corresponding to the cross-section view of FIG. 9. As will be described below, FIG. 9 will be described together. Hereinafter, a manufacturing method of the display device DD_1 will be described mainly based on a method different from the manufacturing method illustrated in FIGS. 8A to 8E.

Figure 11A:
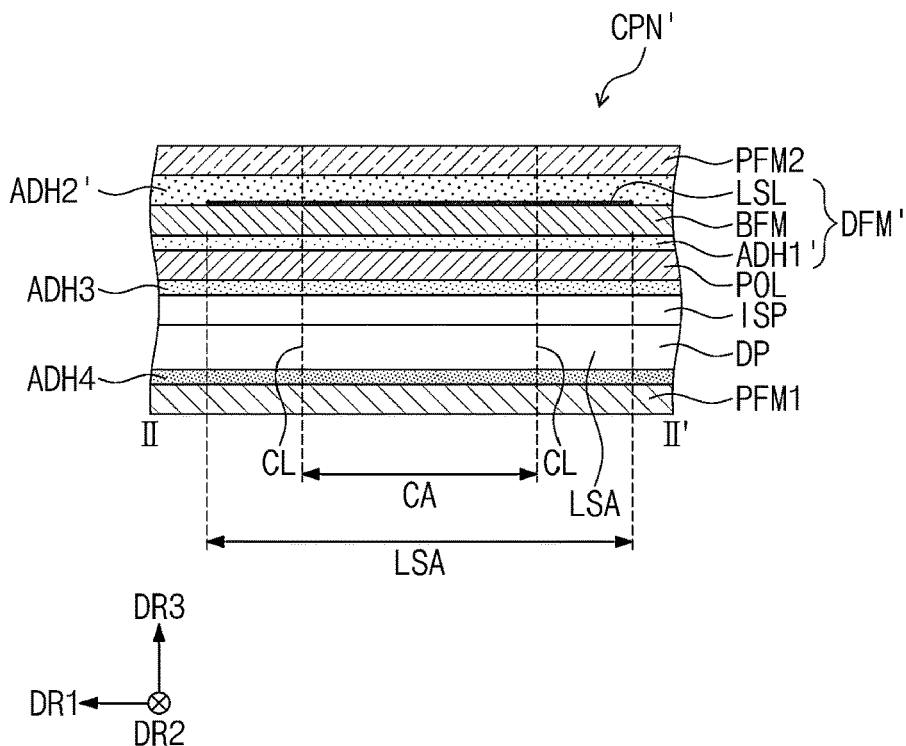
FIG. 11A to 11E are views for explaining another embodiment of a method for manufacturing a display device according to the invention.

Referring to FIG. 11A, a panel CPN' may be prepared. The panel CPN' may include a display panel DP, an input sensing part ISP, a polarizing film POL, a deco film DFM', a first protective film PFM1, a second protective film PFM2, and second, third, and fourth adhesives ADH2', ADH3, and ADH4. The decor film DFM' may include a base film BFM, a light blocking layer LSL, and a first adhesive ADH1".

The lamination structure from the first protective film PFM1 to the second adhesive ADH2' is substantially the same as the lamination structure illustrated in FIG. 9. The decor film DFM' may be disposed between the polarizing film POL and the second adhesive ADH2'. The second protective film PFM2 may be disposed on the second adhesive ADH2".

A cutoff area CA overlapping the first hole H1 illustrated in FIG. 9 may be defined in a panel CPN'. The cutoff area CA may be defined as a cutoff line CL having a closed curve.

Figure 11B:
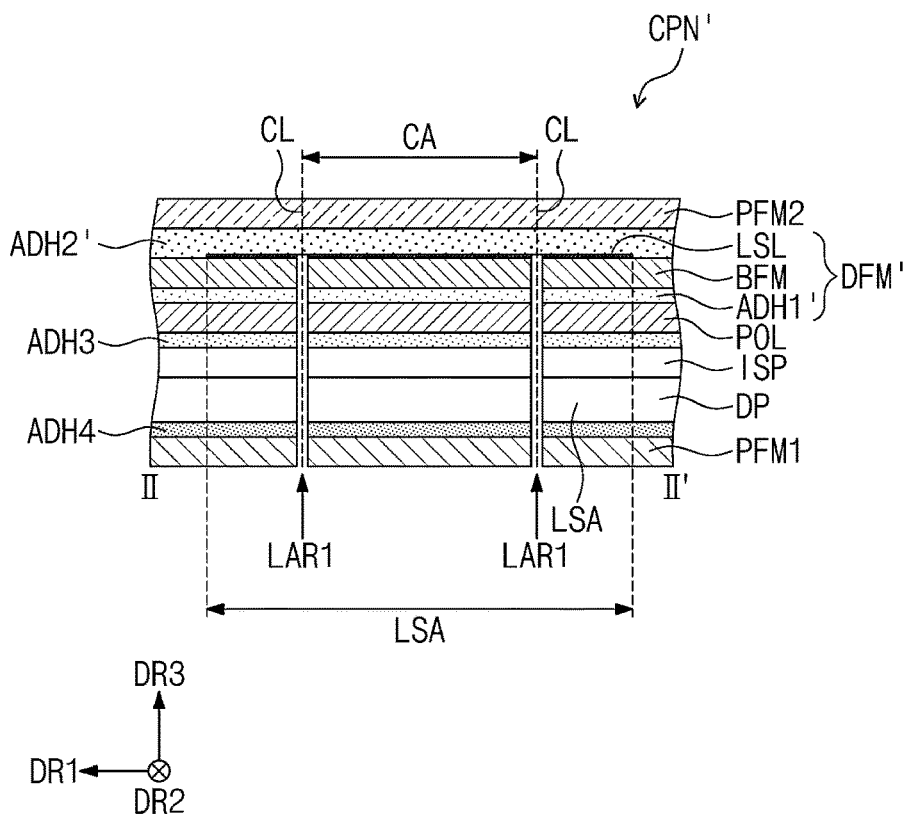

Referring to FIG. 11B, first laser light LAR1 may be irradiated from a lower side of the first protective film PFM1 toward the cutoff line CL. Portions of the first protective film PFM1, the fourth adhesive ADH4, the display panel DP, the input sensing part ISP, the third adhesive ADH3, the polarizing film POL, and the deco film DFM', which overlap the cutoff area CA, may be cut by the first laser light LAR1. A portion of the panel CPN' below the second adhesive ADH2' may be cut by the first laser light LAR1.

Figure 11C:
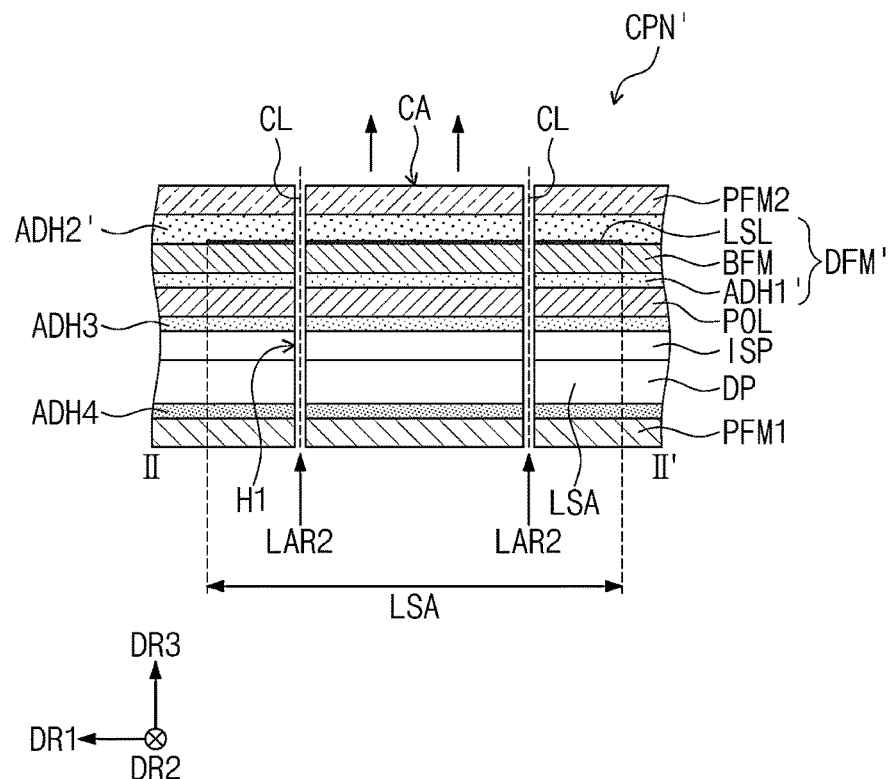

Referring to FIG. 11C, the second laser light LAR2 may be irradiated from a lower side of the first protective film PFM1 toward the cutoff line CL. Portions of the second adhesive ADH2' and the second protective film PFM2, which overlap the cutoff area CA, may be cut by the second laser light LAR2.

The cutoff line CL may be cut through the first and second laser light LAR1 and LAR2, and the cutoff area CA may be separated and removed from the panel CPN'. As a result, a first hole H1 may be defined in the panel CPN'. The second adhesive ADH2', which includes an optical clear adhesive and is thicker than each of each of other adhesives ADH1, ADH3, ADH4, and ADH5, may be cut by the second laser light LAR2 having higher energy.

Figure 11D:
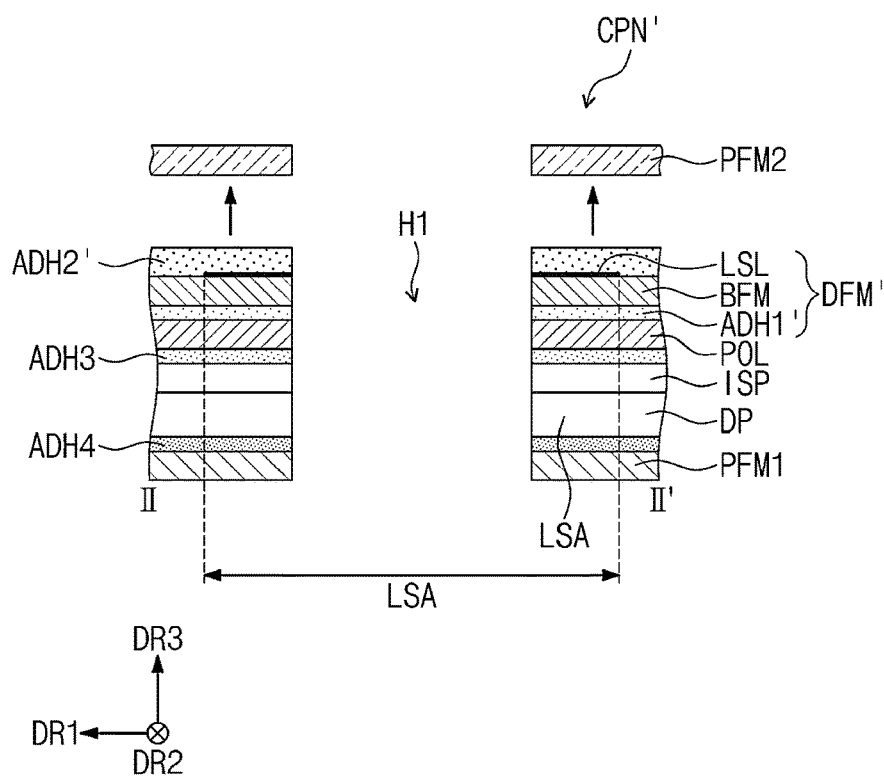
Figure 11E:
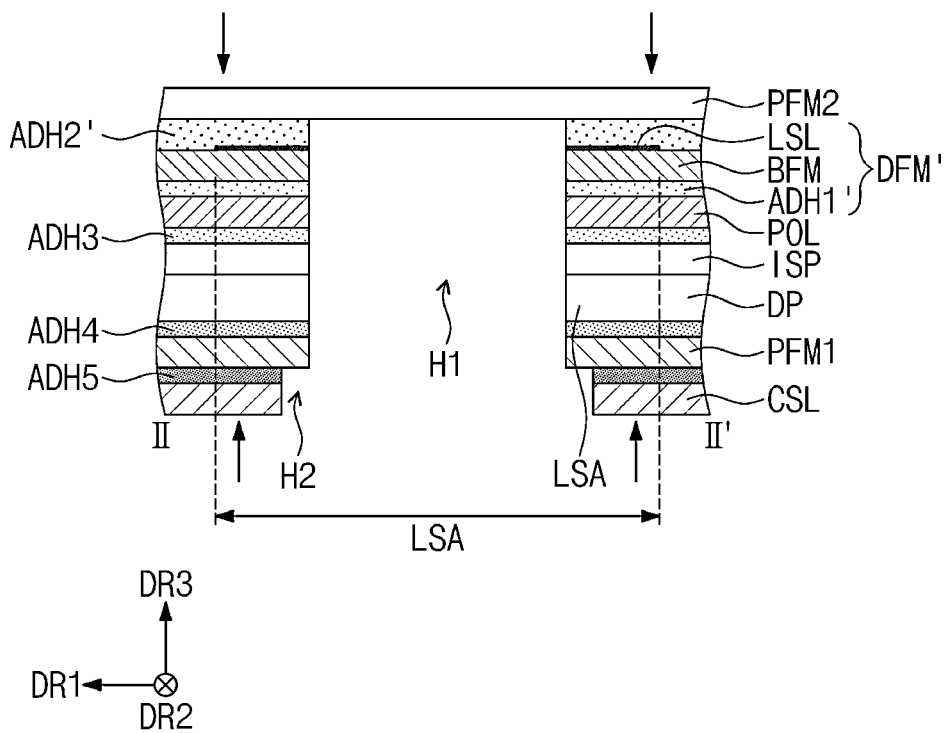

Referring to FIGS. 11D and 11E, in the panel CPN', the second protective film PFM2 may be removed. A window WIN may be provided on the second adhesive ADH2', and a fifth adhesive ADH5 and a cushion layer CSL may be provided below the first protective film PFM1. A second hole H2 larger than the first hole H1 may be defined in the fifth adhesive ADH5 and the cushion layer CSL.

The window WIN may be attached to the base film BFM by the second adhesive ADH2'. The cushion layer CSL may be attached to the first protective film PFM1 by the fifth adhesive ADH5. As illustrated in FIG. 9, the camera CAM may be disposed in the first hole H1 and the second hole H2 to manufacture the display device DD.

Figure 12:
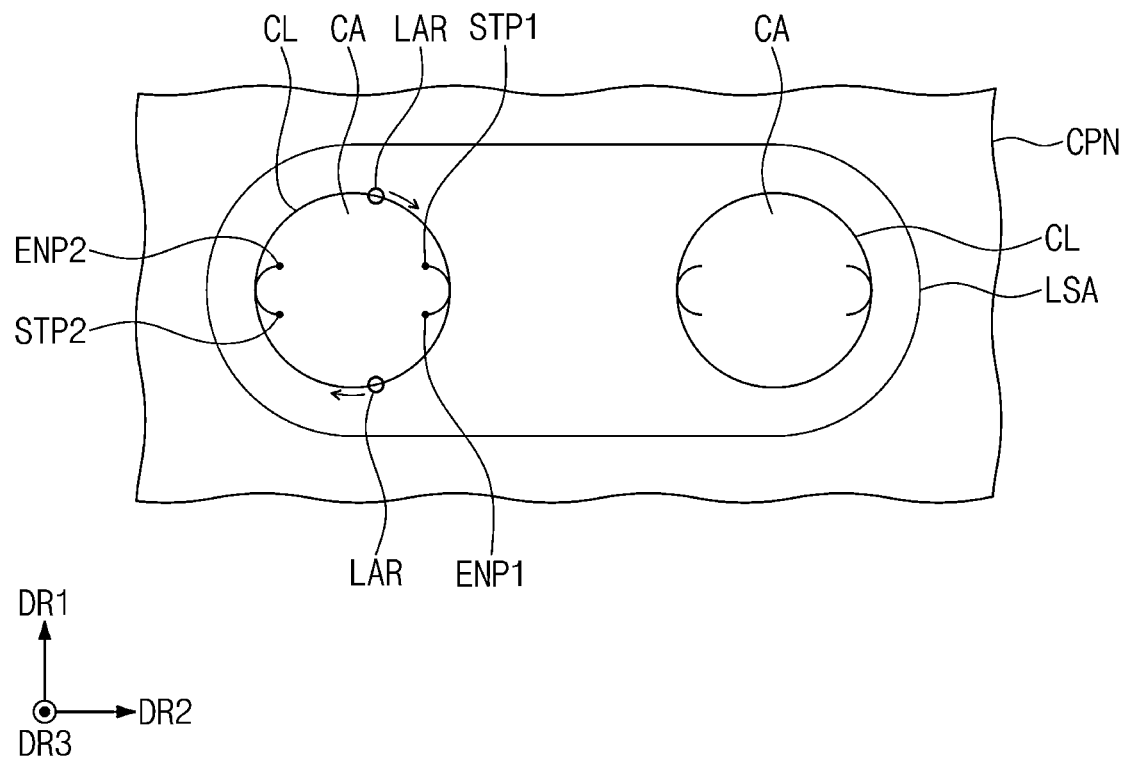
FIG. 12 is a view for explaining an embodiment of a moving method of laser light, which is used in the method for manufacturing the display device according to the invention.
Figure 13A:
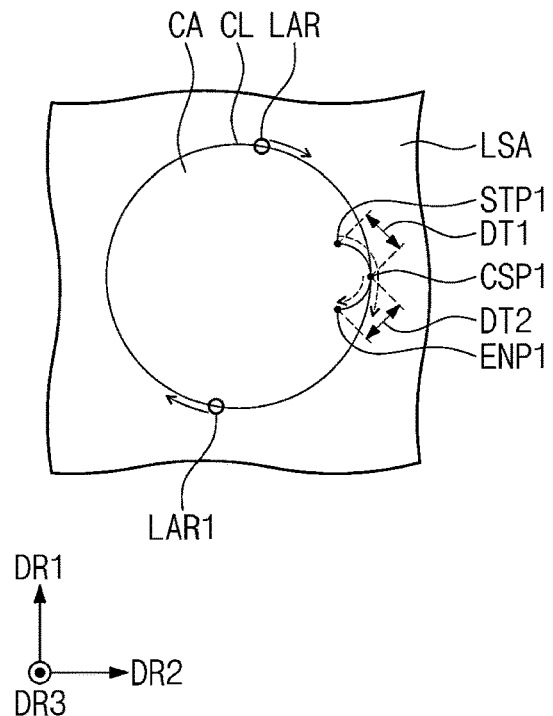
FIGS. 13A and 13B are views for explaining movements of first laser light and second laser light, provided in one cutoff line of FIG. 12.
Figure 13B:
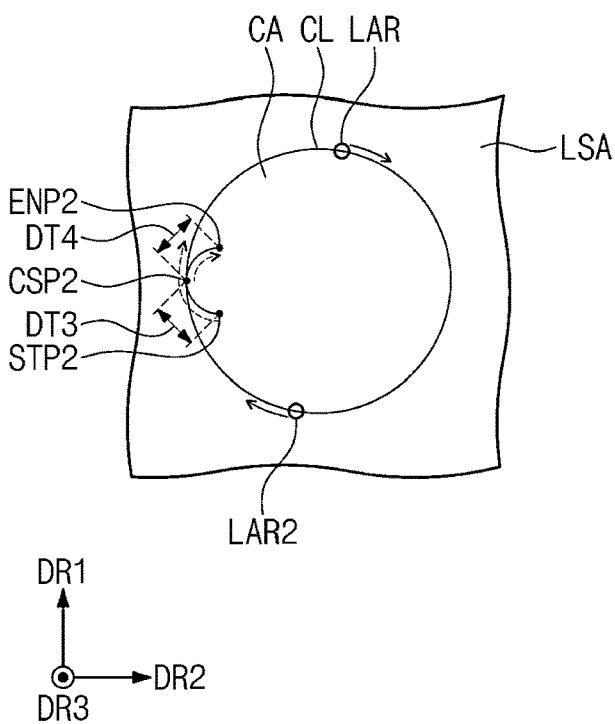
Figure 14A:
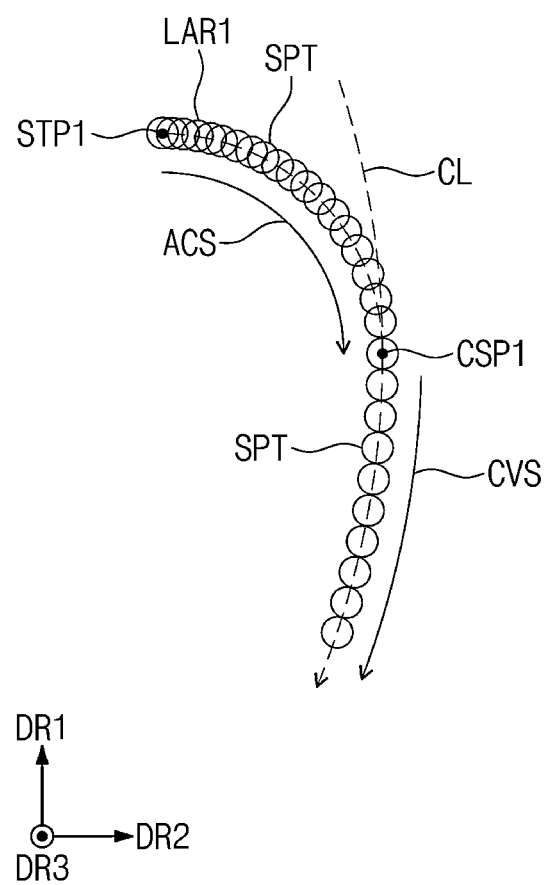
FIGS. 14A and 14B are enlarged views illustrating movements of a first start point, a first intersection point, and a first end point of the first laser light of FIG. 13A.
Figure 14B:
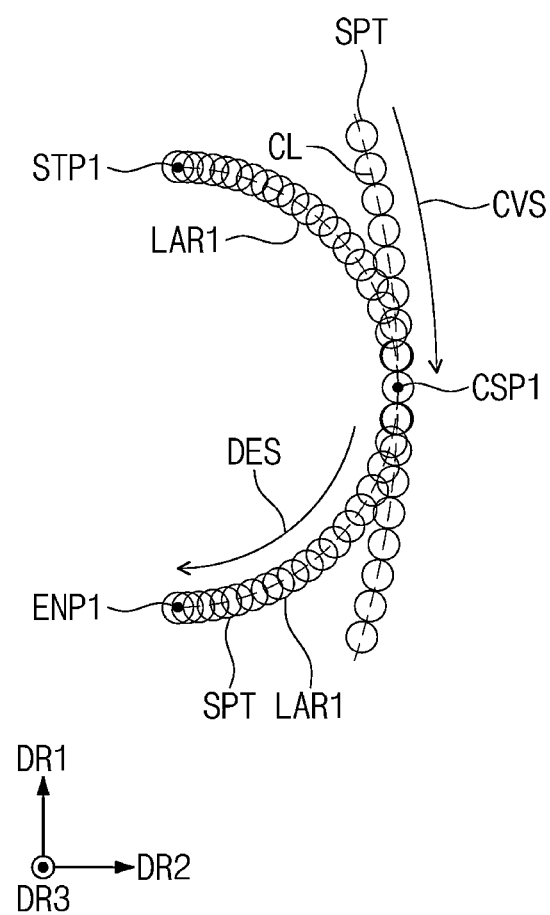

FIG. 12 is a view for explaining an embodiment of a moving method of laser light, which is used in the method for manufacturing the display device according to the invention. FIGS. 13A and 13B are views for explaining movements of first laser light and second laser light, provided in one cutoff line of FIG. 12. FIGS. 14A and 14B are enlarged views illustrating movements of a first start point, a first intersection point, and a first end point of the first laser light of FIG. 13A.

The method of moving the laser light illustrated in FIGS. 12 to 14B may be used not only for the method for manufacturing the display device DD illustrated in FIGS. 8A to 8E but also for the method for manufacturing the display device DD_1 illustrated in FIGS. 11A to 11E. In an embodiment, to cut the panels CPN and CPN', a moving method of the laser light illustrated in FIGS. 12 to 14B may be used, for example. FIGS. 13A and 13B illustrate enlarged views of a cutoff area CA, for example.

Referring to FIG. 12, laser light LAR may be irradiated to a cutoff lines CL to remove the cutoff areas CA defined in a light blocking area LSA. The laser light LAR may include a first laser light LAR1 and a second laser light LAR2 described above.

The laser light LAR may be provided from a first start point STP1 to a first end point ENP1 via the cutoff line CL. Also, the laser light LAR may be provided from the second start point STP2 to the second end point ENP2 through the cutoff line CL. This, this operation will be described in detail below.

The laser light LAR irradiated in the third direction DR3 is illustrated as a circle overlapping the cutoff line CL. The circle overlapping the cutoff line CL may indicate a spot of the laser light LAR. A size of the circle overlapping the cutoff line CL may indicate a spot size. The spot of the laser light LAR may be defined as an area exerted by energy of the laser light LAR.

Referring to FIG. 13A, a first intersection point CSP1 may be defined in the cutoff line CL. The first start point STP1 and the first end point ENP1 may be defined inside the cutoff line CL, that is, on the cutoff area CA. The first start point STP1 and the first end point ENP1 may be provided at different positions. The first start point STP1 and the first end point ENP1 may be adjacent to the first intersection point CSP1.

The first start point STP1 may be spaced apart from the first intersection point CSP1 by a first distance DT1, and the first end point ENP1 may be spaced apart from the first intersection point CSP1 by a second distance DT2. The first distance DT1 may be the same as the second distance DT2, but is not limited thereto. In an embodiment, the first distance DT1 may be different from the second distance DT2, for example.

The first laser light LAR1 of the laser light LAR may be provided from the first start point STP1 to the first intersection point CSP1. In an embodiment, the first laser light LAR1 may be provided in a curve shape from the first start point STP1 to the first intersection point CSP1, for example. However, the invention is not limited thereto, and the first laser light LAR1 may be provided in a straight line shape from the first start point STP1 to the first intersection point CSP1.

Thereafter, the first laser light LAR1 may be provided along the cutoff line CL. Thereafter, the first laser light LAR1 may be provided up to the first end point ENP1 after passing through the first intersection point CSP1. In an embodiment, the first laser light LAR1 may be provided in a curve shape from the first intersection point CSP1 to the first end point ENP1, for example. However, the invention is not limited thereto, and the first laser light LAR1 may be provided in a straight line shape from the first intersection point CSP1 to the first end point ENP1.

Referring to FIG. 13B, a second intersection point CSP2 may be defined in the cutoff line CL. The second intersection point CSP2 may be provided at a position different from the first intersection point CSP1. A second start point STP2 and a second end point ENP2 may be defined inside the cutoff line CL. The second start point STP2 and the second end point ENP2 may be provided at different positions.

The second start point STP2 and the second end point ENP2 may be adjacent to the second intersection point CSP2. The second start point STP2 and the second end point ENP2 may be provided at positions different from the first start point STP1 and the first end point ENP1.

The second start point STP2 may be spaced apart from the second intersection point CSP2 by a third distance DT3, and the second end point ENP2 may be spaced apart from the second intersection point CSP2 by a fourth distance DT4. The third distance DT3 may be the same as the fourth distance DT4, but is not limited thereto. In an embodiment, the third distance DT3 may be different from the fourth distance DT4, for example.

The second laser light LAR2 of the laser light LAR may be provided from the second start point STP2 to the second intersection point CSP2. In an embodiment, the second laser light LAR2 may be provided in a curve shape from the second start point STP2 to the second intersection point CSP2, for example. However, the invention is not limited thereto, and the second laser light LAR2 may be provided in a straight line shape from the second start point STP2 to the second intersection point CSP2.

Thereafter, the second laser light LAR2 may be provided along the cutoff line CL. Thereafter, the second laser light LAR2 may be provided to the second end point ENP2 after passing through the second intersection point CSP2. In an embodiment, the second laser light LAR2 may be provided in a curve shape from the second intersection point CSP2 to the second end point ENP2, for example. However, the invention is not limited thereto, and the second laser light LAR2 may be provided in a straight line shape from the second intersection point CSP2 to the second end point ENP2.

FIGS. 13A and 13B, the first and second laser light LAR1 and LAR2 may be provided to the cutoff line CL while rotating in a clockwise direction. However, the invention is not limited thereto, and the first and second laser light LAR1 and LAR2 may be provided to the cutoff line CL while rotating in a counterclockwise direction.

The first and second laser light LAR1 and LAR2 may not be limited to the moving directions described with reference to FIGS. 13A and 13B. In an embodiment, the first laser light LAR1 may move in the moving direction illustrated in FIG. 13B, and the second laser light LAR2 may move in the moving direction illustrated in FIG. 13A, for example.

Referring to FIGS. 14A and 14B, after the first laser light LAR1 is initially provided to the first start point STP1, when the first laser light LAR1 moves from the first intersection point CSP1 from the first start point STP1, the first laser light LAR1 may be gradually accelerated. A section from the first start point STP1 to the first intersection point CSP1 may be defined as an acceleration section ACS of the first laser light LAR1.

Thereafter, when the first laser light LAR1 moves from the first intersection point CSP1 along the cutoff line CL, the first laser light LAR1 may be maintained at an accelerated speed up to the first intersection point CSP1 to move at a constant speed along the line CL. A section of the first laser light LAR1 moving along the cutoff line CL may be defined as a constant velocity section CVS.

Thereafter, when the first laser light LAR1 moves from the first intersection point CSP1 to the first end point ENP1, the first laser light LAR1 may be gradually decelerated from the first intersection point CSP1. A section from the first intersection point CSP1 to the first end point ENP1 may be defined as a deceleration section DES of the first laser light LAR1.

In a moving velocity of the first laser light LAR1, the moving velocity when moving the cutoff line CL may be faster than that when moving from the first start point STP1 to the first intersection point CSP1 and when moving the first intersection point CSP1 to the first ending point ENP1.

In an embodiment, each of the circles illustrated in FIGS. 14A and 14B represents a spot SPT of the first laser light LAR1, for example. When the moving velocity of the first laser light LAR1 is slow, overlapping portions of the spots SPT may increase. When the moving velocity of the first laser light LAR1 is fast, overlapping portions of the spots SPT may decrease.

Since the moving velocity of the first laser light LAR1 is slow in the acceleration and deceleration sections ACS and DES of the first laser light LAR1 from the first start point STP1 to the first intersection point CSP1 and from the first intersection point CSP1 to the first end point ENP1, the overlapping portions of the spots SPT may increase.

When the first laser light LAR1 moves along the cutoff line CL, since the first laser light LAR1 more quickly moves at a constant speed, the overlapping portions of the spots SPT may decrease. In an embodiment, when the first laser light LAR1 moves along the cutoff line CL, boundaries of the spots SPT may overlap each other, for example.

When the first laser light LAR1 moves slowly to increase in overlapping portion of the spots SPT, more heat may be applied to an object to be processed. When the moving start and end points of the first laser light LAR1 are arranged on the cutoff line CL, more heat may be applied to the cutoff line CL in the acceleration and deceleration sections ACS and DES of the first laser light LAR1. In this case, an inner surface of the panel CPN, which overlaps the cutoff line CL and defines the first hole H1 may be damaged. The display device DD manufactured using the panel CPN may also include the damaged portion.

However, in an embodiment of the invention, the first start point STP1 and the first end point ENP1 may be disposed inside the cutoff line CL. Thus, the acceleration and deceleration sections ACS and DES of the first laser light LAR1 may be disposed on the cutoff area CA. Since the acceleration and deceleration sections ACS and DES of the first laser light LAR1 are disposed on the cutoff area CA, which are portions to be removed and discarded, the inner surface of the panel CPN may be prevented from being damaged. Therefore, when the display device DD is manufactured using the moving method of the laser light illustrated in FIGS. 12 to 14B, the damage of the display device DD may be prevented.

Figure 15:
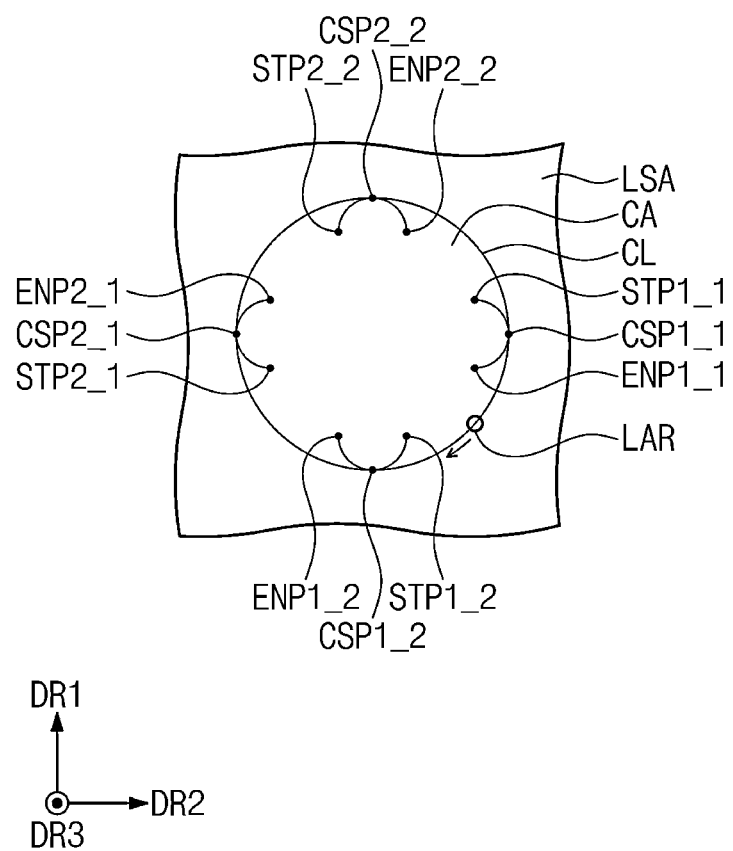
FIG. 15 is a view for explaining an embodiment of a moving method of laser light, which is used in the method for manufacturing the display device according to the invention.

FIG. 15 is a view for explaining an embodiment of a moving method of laser light, which is used in the method for manufacturing the display device according to the invention. FIGS. 16A to 16D are views for explaining movements of first laser light and second laser light, provided in a cutoff line of FIG. 15.

Hereinafter, for example, a moving method of the laser light LAR for cutting one cutoff areas CA will be described. Also, a moving method of the laser light LAR will be described mainly based on a method different from the moving method of the laser light LAR illustrated in FIGS. 12 to 14B.

Referring to FIG. 15, the laser light LAR may be provided to the cutoff line CL plural times, for example, may be provided four times. However, the number of providing times of the laser light LAR may be greater. Whenever the laser light LAR is provided, the start point, the end point, and the intersection point may vary.

Figure 16A:
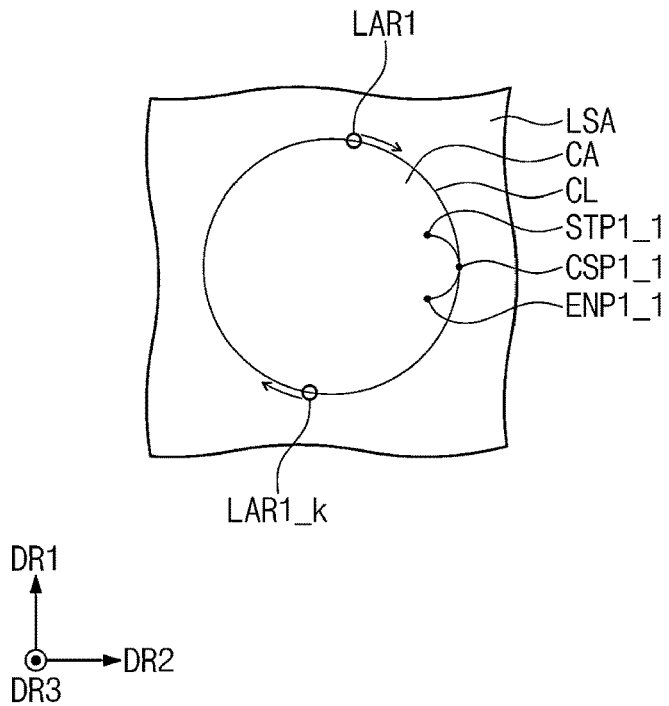
FIGS. 16A to 16D are views for explaining movements of first laser light and second laser light, provided in a cutoff line of FIG. 15.

FIGS. 15 and 16A, the first laser light LAR1 may be provided plural times. In an embodiment, k-th first laser light LAR1_$k$ may be provided along a first start point STP1_1, a first intersection point CSP1_1, a cutoff line CL, a first intersection point CSP1_1, and a first end point ENP1_1, for example. Here, k is a natural number.

Figure 16B:
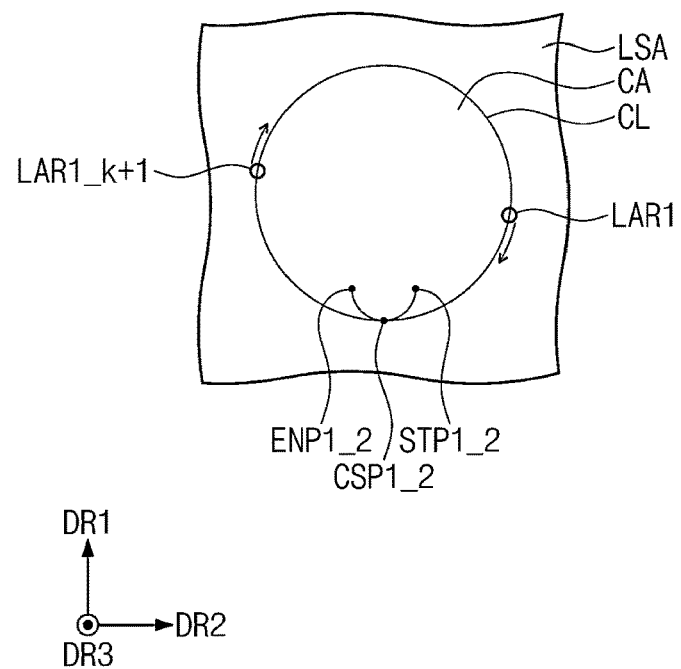

Referring to FIGS. 15 and 16B, (k+1)-th first laser light LAR1_$k$+1 may be provided along a first start point STP1_2, a first intersection point CSP1_2, a cutoff line CL, and a first intersection point CSP1_2, and the first end point ENP1_2. In an embodiment, the first laser light LAR1 is provided two times, for example, but the first laser light LAR1 may be provided more than two times.

The first start point STP1_1, the first intersection point CSP1_1, and the first end point ENP1_1 along which the k-th first laser light LAR1_$k$ moves may be provided at positions different from those of the first start point STP1_2, the first intersection point CSP1_2, and the first end point ENP1_2 along which the (k+1)-th first laser light LAR1_$k$+1 moves.

Figure 16C:
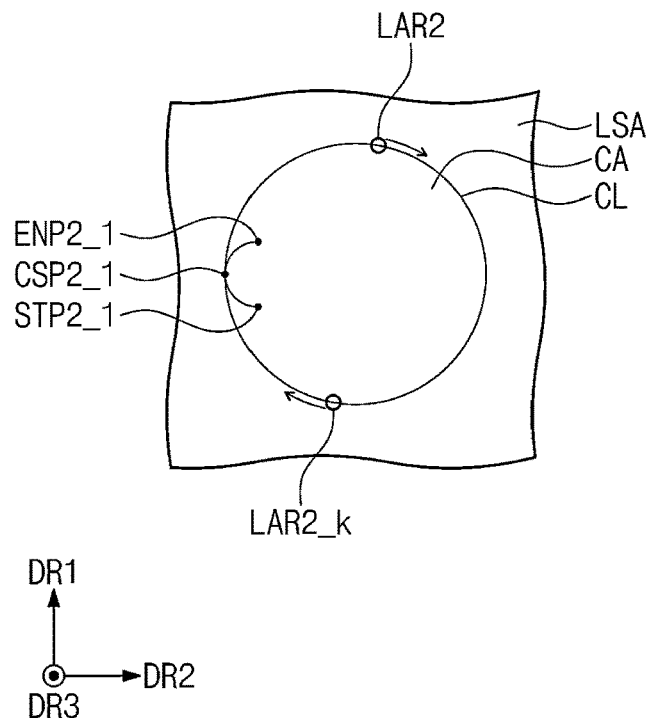

Referring to FIGS. 15 and 16C, the second laser light LAR2 may be provided plural times. In an embodiment, the k-th second laser light LAR2_$k$ may be provided along a second start point STP2_1, a second intersection point CSP2_1, a cutoff line CL, a second intersection point CSP2_1, and a second end point ENP2_1, for example.

Figure 16D:
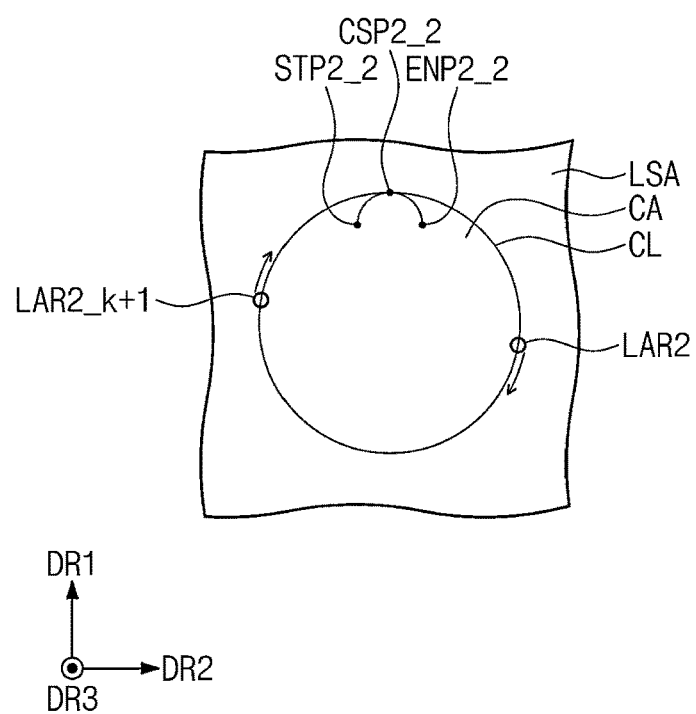

Referring to FIGS. 15 and 16D, thereafter, (k+1)-th second laser light LAR2_k+1 may be provided along a second start point STP2_2, a second intersection point CSP2_2, a cutoff line CL, a second intersection point CSP2_2, and a second end point ENP2_2. In an embodiment, the second laser light LAR2 is provided two times, for example, but the second laser light LAR2 may be provided more than two times.

The second start point STP2_1, the second intersection point CSP2_1, and the second ending point ENP2_1 along which the k-th second laser light (LAR2_k) moves may be provided at positions different from those of the moving second start point STP2_2, the second intersection point CSP2_2, and the second end point ENP2_2 along which the (k+1)-th second laser light LAR2_k+1 moves.

In an embodiment, each of the first and second laser light LAR1 and LAR2 is provided two times, for example, but is not limited thereto. In an embodiment, the first laser light LAR1 may be provided once, and the second laser light LAR2 may be provided two or more times, for example. Also, the first laser light LAR1 may be provided two or more times, and the second laser light LAR2 may be provided once.

To cut the panels CPN and CPN', the moving method of the laser light illustrated in FIGS. 15 to 16D may be used.

Figure 17:
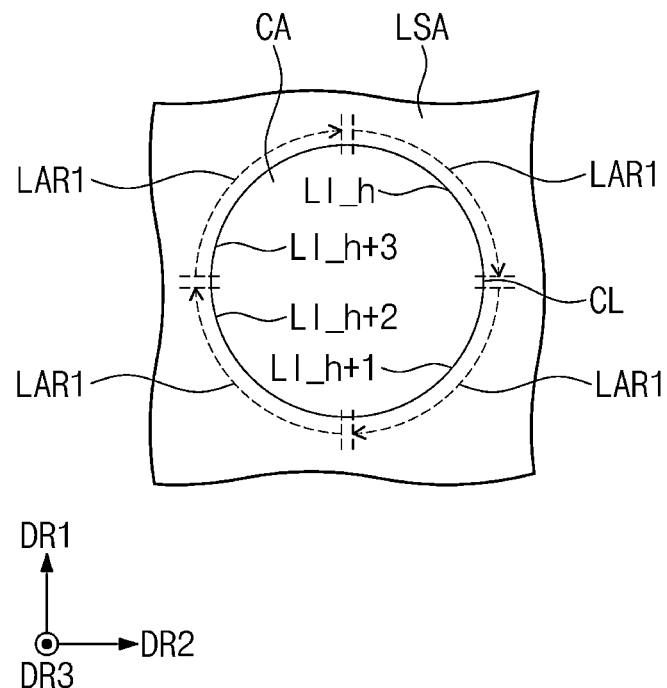
FIG. 17 is a view for explaining an embodiment of a moving method of laser light, which is used in the method for manufacturing the display device according to the invention.
Figure 18:
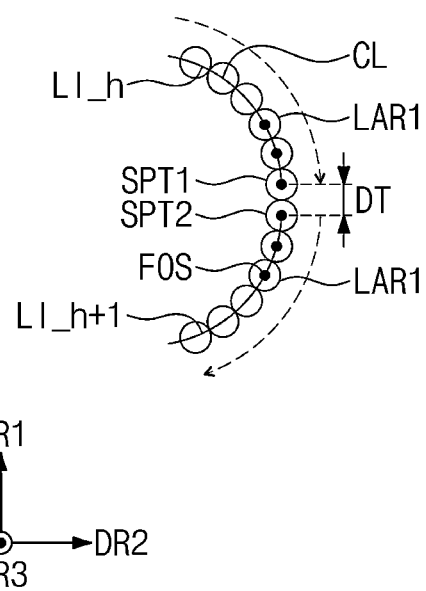
FIG. 18 is an enlarged view of an h-th sub line and an (h+1)-th sub line, which are adjacent to each other, in FIG. 17.

FIG. 17 is a view for explaining an embodiment of a moving method of laser light, which is used in the method for manufacturing the display device according to the invention. FIG. 18 is an enlarged view of an h-th sub line and an (h+1)-th sub line, which are adjacent to each other, in FIG. 17.

Referring to FIGS. 17 and 18, the cutoff line CL may include a plurality of sub lines LI_h to LI_h+3 spaced apart from each other. In an embodiment, although four sub lines LI_h to LI_h+3 are illustrated, the number of sub lines LI_h to LI_h+3 is not limited thereto, and may be more than at least two, for example. Here, h is a natural number.

The first laser light LAR1 may be provided to each of the sub lines LI_h to LI_h+3. The first laser light LAR1 may be sequentially provided to the h-th sub line LI_h, the (h+1)-th sub line LI_h+1, the (h+2)-th sub line LI_h+2, and the (h+3)-th sub line LI_h+3. That is, the intersection point may not be defined in the cutoff line CL, and the first laser light LAR1 may be respectively provided to the selective portions of the cutoff line CL.

Although not shown, after the first laser light LAR1 is provided to each of the sub lines LI_h to LI_h+3, the second laser light LAR2 may be provided to each of the sub lines LI_h to LI_h+3.

Referring to FIG. 18, a boundary of the spot SPT1 of the first laser light LAR1 provided at an end of the h-th sub line LI_h may overlap a boundary of the spot SPT2 of the first laser light LAR1 provided at an end of the (h+1)-th sub line LI_h+1, which is adjacent to the end of the h-th sub line LI_h.

Although the first laser light LAR1 is provided to the h-th sub line LI_h and the (h+1)-th sub line LI_h+1, the spots SPT1 and SPT2 may also be provided to the cutoff line CL between the h-th sub line LI_h and the (h+1)-th sub line LI_h+1. That is, an area on which the first laser light LAR1 is not provided may not exist in the cutoff line CL. Therefore, the cutoff line CL may be cut by the first laser light LAR1.

Although not shown, the boundaries of the spots of the first laser light LAR1 may overlap each other at an end of the (h+1)-th sub line LI_h+1 and an end of the (h+2)-th sub line LI_h+2, which are adjacent to each other, at an end of the (h+2)-th sub line LI_h+2 and an end of the (h+3)-th sub line LI_h+3, which are adjacent to each other, and at an end of the (h+3)-th sub line LI_h+3 and an end of the h-th sub line LI_h, which are adjacent to each other.

In an embodiment, a distance DT between the end of the h-th sub line LI_h and the end of the (h+1)-th sub line LI_h+1, which are adjacent to each other, may be about 20 millimeters (mm) to about 1 mm, for example. A center of each of the spots SPT1 and SPT2 of the first laser light LAR1 may be a focal point FOS of the first laser light LAR1. Thus, the distance DT may be defined as a distance between the center of the spot SPT1 and the center of the spot SPT2.

To cut the panels CPN and CPN', the moving method of the laser light illustrated in FIGS. 17 and 18 may be used.

Figure 19:
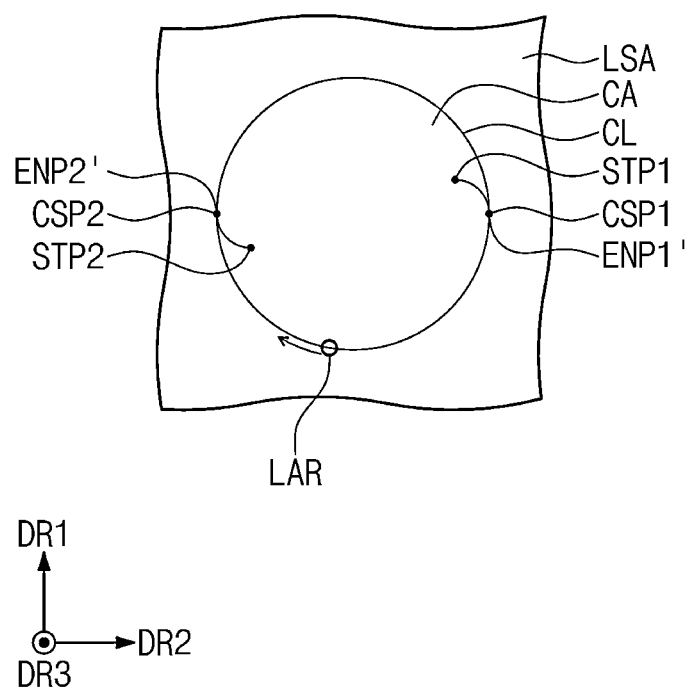
FIG. 19 is a view for explaining an embodiment of a moving method of laser light, which is used in the method for manufacturing the display device according to the invention.
Figure 20A:
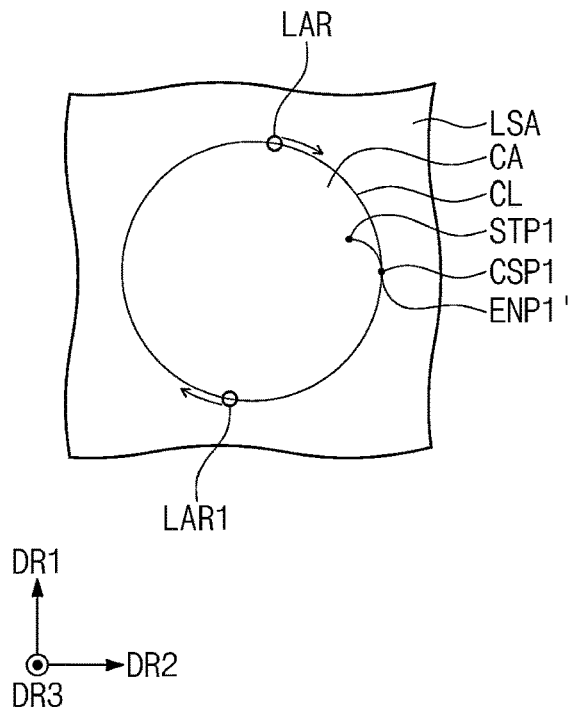
FIGS. 20A and 20B are views for explaining movements of first laser light and second laser light, provided in a cutoff line of FIG. 19.
Figure 20B:
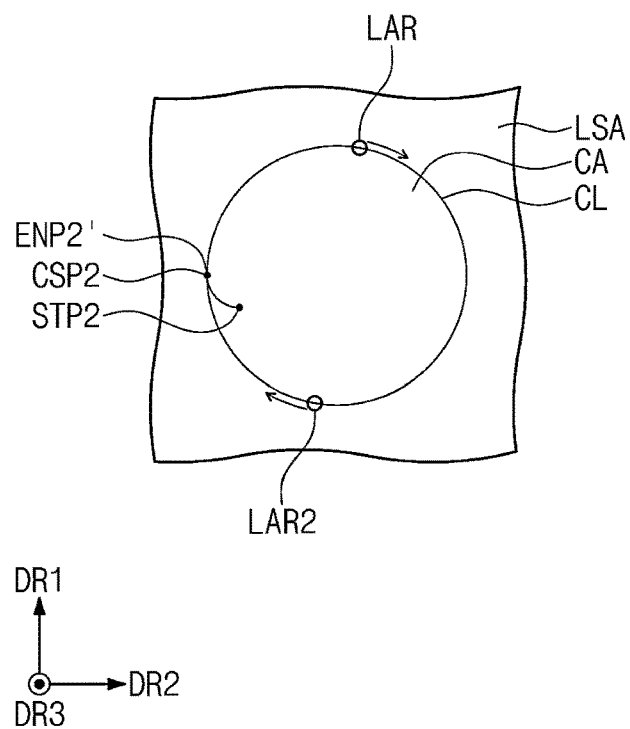

FIG. 19 is a view for explaining an embodiment of a moving method of laser light, which is used in the method for manufacturing the display device according to the invention. FIGS. 20A and 20B are views for explaining movements of first laser light and second laser light, provided in a cutoff line of FIG. 19.

Referring to FIGS. 19 and 20A, a first start point STP1 and a first intersection point CSP1 may be the same as the first start point STP1 and the first intersection point CSP1 illustrated in FIG. 13A. Unlike the first end point ENP1 illustrated in FIG. 13A, a first end point ENP1' illustrated in FIGS. 19 and 20A may overlap the first intersection point CSP1. The first laser light LAR1 may be provided from the first start point STP1 to the first intersection point CSP1 and may be provided up to the first ending point ENP1' along the cutoff line CL.

Referring to FIGS. 19 and 20B, a second start point STP2 and a second intersection point CSP2 may be the same as the second start point STP2 and the second intersection point CSP2 illustrated in FIG. 13B. Unlike the second end point ENP2 illustrated in FIG. 13B, a second end point ENP2' illustrated in FIGS. 19 and 20B may overlap the second intersection point CSP2. The second laser light LAR2 may be provided from the second start point STP2 to the second intersection point CSP2 and may be provided up to the second ending point ENP2' along the cutoff line CL.

To cut the panels CPN and CPN', the moving method of the laser light illustrated in FIGS. 19 to 20B may be used.

Figure 21:
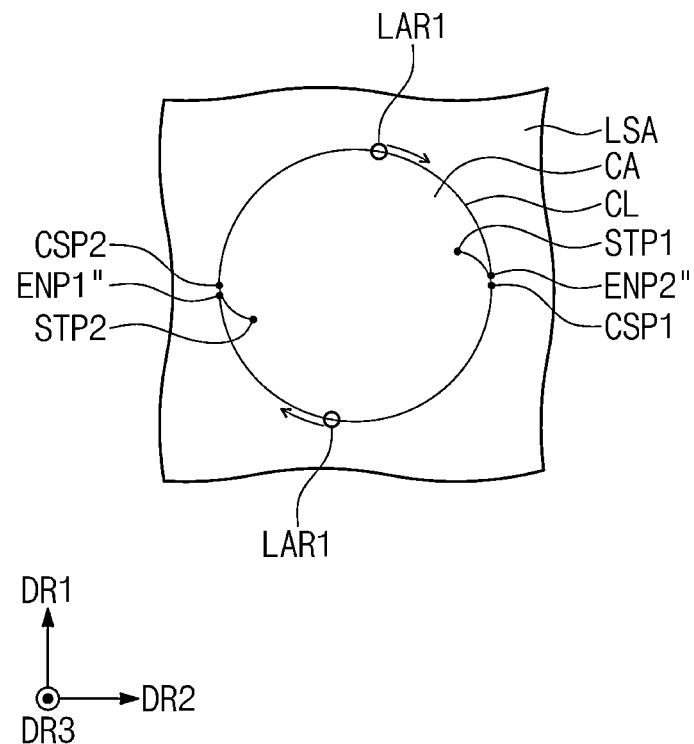
FIG. 21 is a view for explaining an embodiment of a moving method of laser light, which is used in the method for manufacturing the display device according to the invention.
Figure 22:
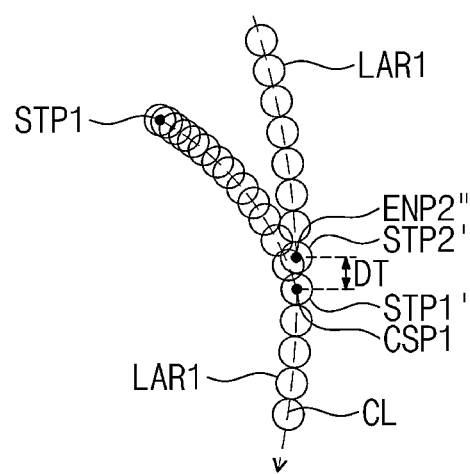
FIG. 22 is an enlarged view of first and second laser light provided are at a first intersection point and a second end point, which are adjacent to each other, in FIG. 21.

FIG. 21 is a view for explaining an embodiment of a moving method of laser light, which is used in the method for manufacturing the display device according to the invention. FIG. 22 is an enlarged view of first and second laser light provided are at a first intersection point and a second end point, which are adjacent to each other, in FIG. 21.

In FIG. 21, portions to which the first and second laser light are provided are illustrated by bold lines, for example.

Referring to FIG. 21, a first start point STP1 and a first intersection point CSP1 may be the same as the first start point STP1 and the first intersection point CSP1 illustrated in FIG. 13A. A second start point STP2 and a second intersection point CSP2 may be the same as the second start point STP2 and the second intersection point CSP2 illustrated in FIG. 13B. The first and second intersection points CSP1 and CSP2 may be moving points of the first laser light LAR1 overlapping the cutoff line CL.

A first end point ENP1" and a second end point ENP2" may be defined in the cutoff line CL. The first end point ENP1" and the second end point ENP2" may be provided at different positions. The first end point ENP1" may be adjacent to the second intersection point CSP2. The second end point ENP2" may be adjacent to the first intersection point CSP1. A section of the cutoff line CL defined from the first intersection point CSP1 to the first end point ENP1" may not overlap a section of the cutoff line CL defined from the second intersection point CSP2 to the second end point ENP2".

The first laser light LAR1 may pass from the first start point STP1 to the first intersection point CSP1 and be provided to the first ending point ENP1" along the cutoff line CL. In addition, the first laser light LAR1 may pass from the second start point STP2 to the second intersection point CSP2 and be provided to the second ending point ENP2" along the cutoff line CL.

Although not shown, the second laser light LAR2 may also be provided to the cutoff line CL through the same moving path as the first laser light LAR1.

Referring to FIG. 22, a boundary of the spot SPT2' of the first laser light LAR1 provided to the second end point ENP2" may overlap a boundary of the spot SPT1' of the first laser light LAR1 provided to the first intersection point CSP1. Although not shown, a boundary of the spot of the first laser light LAR1 provided to the first end point ENP1" may overlap a boundary of the spot of the first laser light LAR1 provided to the second intersection point CSP2. Thus, the first and second laser light LAR1 and LAR2 may be provided along the cutoff line CL to cut the cutoff area CA.

To cut the panels CPN and CPN', the moving method of the laser light illustrated in FIGS. 21 and 22 may be used. FIGS. 23A to 23E are views for explaining another embodiment of a method for manufacturing a display device according to the invention.

FIGS. 14 and 16 are cross-sectional views corresponding to the cross-section view of FIG. 6, for example.

Figure 23A:
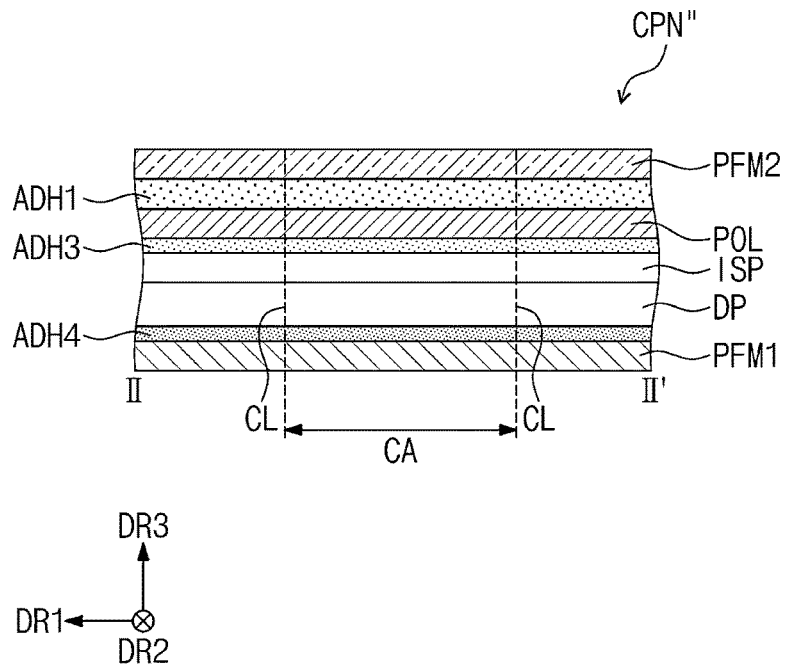
FIG. 23A to 23E are views for explaining an embodiment of a method for manufacturing a display device according to the invention.

Referring to FIG. 23A, a panel CPN" may be prepared. Unlike the panels CPN and CPN' described above, the panel CPN" may not include a deco film DFM (refer to FIG. 8A, for example). In an embodiment, the panel CPN includes a display panel DP, an input sensing part ISP, a polarizing film POL, a first protective film PFM1, a second protective film PFM2, and first, third, and fourth adhesives ADH1, ADH3, and ADH4, for example. The first adhesive ADH1 may be disposed on the polarizing film POL, and the second protective film PFM2 may be disposed on the first adhesive ADH1.

Figure 23B:
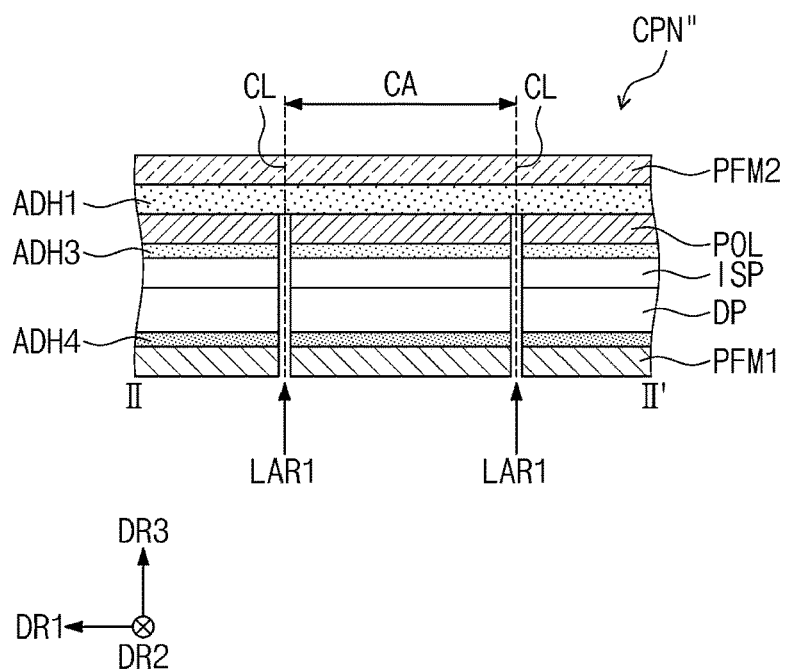

Referring to FIG. 23B, first laser light LAR1 may be irradiated from a lower side of the first protective film PFM1 toward the panel CPN". The first laser light LAR1 may be irradiated toward the cutoff line CL. Portions of the first protective film PFM1, the fourth adhesive ADH4, the display panel DP, the input sensing part ISP, the third adhesive ADH3, and the polarizing film POL, which overlap the cutoff area CA, may be cut by the first laser light LAR1. A portion of the panel CPN" below the first adhesive ADH1 may be cut by the first laser light LAR1.

Figure 23C:
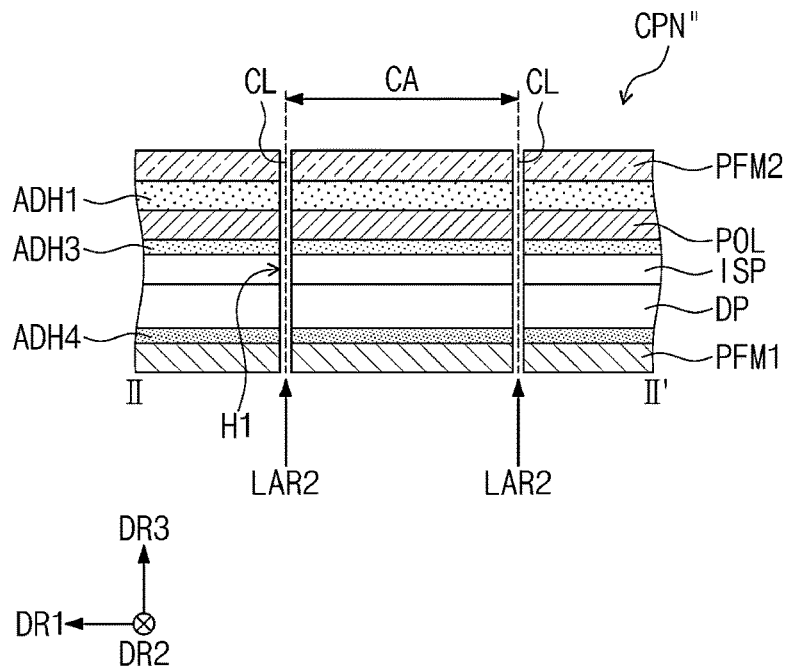

Referring to FIG. 23C, second laser light LAR2 may be irradiated from a lower side of the first protective film PFM1 toward the panel CPN. The second laser light LAR2 may be irradiated toward the cutoff line CL. Portions of the first adhesive ADH1 and the second protective film PFM2, which overlap the cutoff area CA, may be cut by the second laser light LAR2.

The cutoff line CL may be cut through the first and second laser light LAR1 and LAR2, and the cutoff area CA may be separated and removed from the panel CPN". As a result, a first hole H1 may be defined in the panel CPN". The first adhesive ADH1 that is difficult to be cut may be cut through the second laser light LAR2 having higher energy. Thus, a process for cutting the panel CPN" may be performed more easily.

In an embodiment, the first and second laser light LAR1 and LAR2 are used, but are not limited thereto, for example. In an embodiment, a cutting process of the panel CPN" may be performed using one laser light, for example.

Figure 23D:
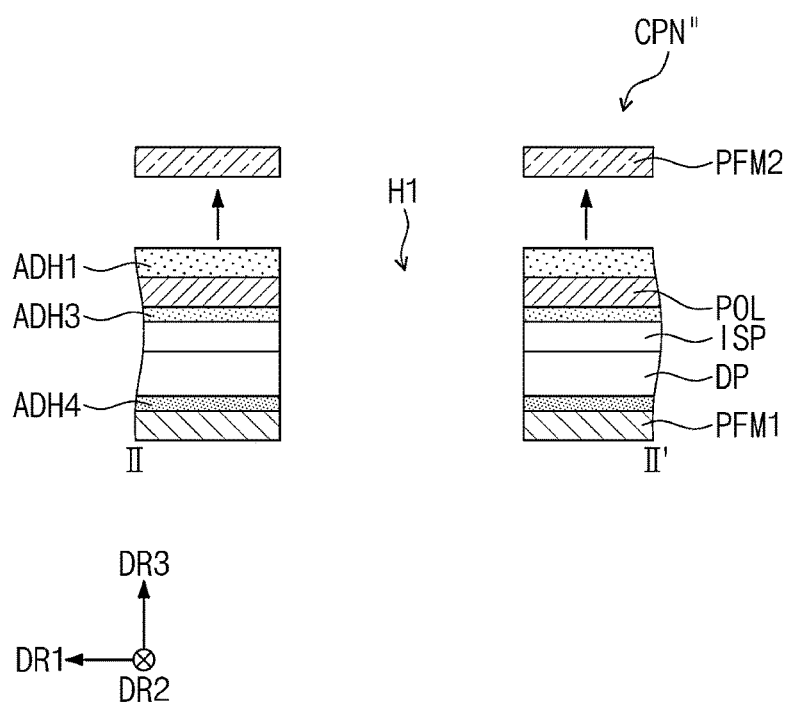
Figure 23E:
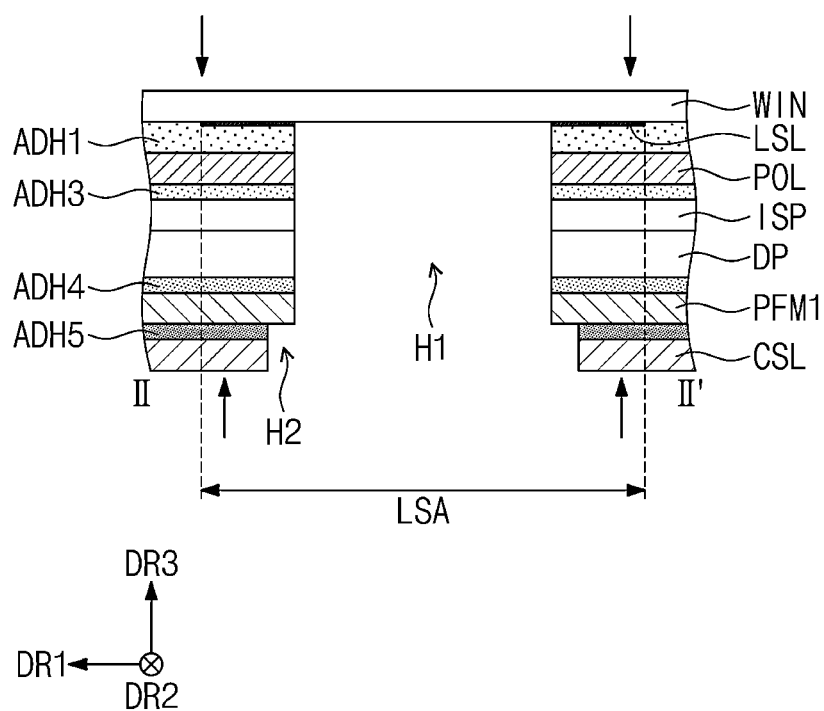

Referring to FIGS. 23D and 23E, in the panel CPN", the second protective film PFM2 may be removed. A window WIN may be provided on the first adhesive ADH1, and a fifth adhesive ADH5 and a cushion layer CSL may be provided below the first protective film PFM1. A second hole H2 larger than the first hole H1 may be defined in the fifth adhesive ADH5 and the cushion layer CSL. A light blocking layer LSL may be disposed on a bottom surface of the window WIN. The light blocking layer LSL may not overlap a first hole H1 but may overlap the light blocking area LSA.

The window WIN may be attached to the polarizing film POL by the first adhesive ADH1. The cushion layer CSL may be attached to the first protective film PFM1 by the fifth adhesive ADH5. As illustrated in FIG. 9, a camera CAM may be disposed in the first hole H1 and the second hole H2 to manufacture the display device.

To cut the panel CPN", the moving method of the laser light illustrated in FIGS. 12 to 22 may be used.

According to the embodiment of the invention, the holes for arranging the functional elements may be more precisely defined in the display device, and the display device may be prevented from being damaged in the process of forming the holes.

It will be apparent to those skilled in the art that various modifications and variations may be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

What is claimed is:

1. A method for manufacturing a display device, the method comprising:
preparing a panel which comprises a display panel, a polarizing film disposed on the display panel, and a first adhesive disposed on the polarizing film and on which a cutoff area defined as a cutoff line having a closed curve is defined; and
irradiating a first intense light toward the cutoff line to cut portions of the display panel and the polarizing film, which overlap the cutoff area,
wherein the first intense light is provided along the cutoff line from a first start point to a first end point, the first start point is disposed inside the cutoff line, and the first end point is provided at different point from the first start point.

2. The method of claim 1, wherein the first intense light is provided from the first start point to a first intersection point of the cutoff line, provided along the cutoff line, and provided to the first end point via the first intersection point, and the first start point and the first end point are provided at different points and disposed inside the cutoff line.

3. The method of claim 1, further comprising irradiating a second intense light toward the cutoff line to cut portion of the first adhesive which overlap the cutoff area.

4. The method of claim 3, wherein the second intense light has power greater than power of the first intense light.

5. The method of claim 3, wherein the second intense light is provided from a second start point to a second intersection point of the cutoff line, provided along the cutoff line, and provided to a second end point via the second intersection point, and the second start point and the second end point are provided at different points and disposed inside the cutoff line.

6. The method of claim 5, wherein the first start point, the first end point, and the first intersection point are disposed at positions different from those of the second start point, the second end point, and the second intersection point.

7. The method of claim 5, wherein the first intense light is provided plural times,
the first start point, the first end point, and the first intersection point, along which k-th first intense light moves, where k is a natural number, are disposed at positions different from those of the first start point, the first end point, and the first intersection point, along which (k+1)-th intense light moves.

8. The method of claim 7, the second intense light is provided plural times, the second start point, the second end point, and the second intersection point, along which k-th second intense light moves, are disposed at positions different from those of the second start point, the second end point, and the second intersection point, along which (k+1)-th intense light moves.

9. The method of claim 5, wherein each of the first and second intense light is provided to an h-th sub line of the cutoff line, where h is a natural number, and an (h+1)-th sub line of the cutoff line, which is spaced apart from the h-th sub line.

10. The method of claim 9, wherein a boundary of a spot of each of the first and second intense light, which are provided to an end of the h-th sub line, overlaps a boundary of a spot of each of the first and second intense light, which are provided to an end of the (h+1)-th sub line adjacent to the end of the h-th sub line.

11. The method of claim 1, further comprising irradiating a second intense light toward the cutoff line to cut portion of the first adhesive which overlap the cutoff area,
wherein the first intense light is provided from the first start point to the first end point via a first intersection point of the cutoff line along the cutoff line, the first start point is disposed inside the cutoff line, and the first end point overlaps the first intersection point.

12. The method of claim 11, wherein the second intense light is provided from a second start point to a second end point via a second intersection point of the cutoff line along the cutoff line, the second start point is disposed inside the cutoff line, and the second end point overlaps the second intersection point.

13. The method of claim 12, wherein the first start point and the second intersection point are provided to positions different from positions of the second start point and the second intersection point.

14. The method of claim 1, further comprising irradiating a second intense light toward the cutoff line to cut portion of the first adhesive which overlap the cutoff area,
wherein the first intense light is provided from the first start point to the first end point defined in the cutoff line via a first intersection point of the cutoff line along the cutoff line, and the first start point is disposed inside the cutoff line, and
the first intense light is provided from a second start point to a second end point disposed in the cutoff line via a second intersection point of the cutoff line along the cutoff line, and the second start point is disposed inside the cutoff line.

15. The method of claim 14, wherein a section of the cutoff line, which is defined from the first intersection point to the first end point, does not overlap a section of the cutoff line, which is defined from the second intersection point to the second end point,
the first end point is adjacent to the second intersection point, and the second end point is adjacent to the first intersection point, and
the first start point, the first end point, and the first intersection point are provided at positions different from those of the second start point, the second end point, and the second intersection point.

16. The method of claim 15, wherein a boundary of a spot of the first intense light provided to the first end point overlaps a boundary of a spot of the first intense light provided to the second intersection point, and
a boundary of a spot of the first intense light provided to the second end point overlaps a boundary of a spot of the first intense light provided to the first intersection point.

* * * * *